(12) United States Patent
Kimerling et al.

(10) Patent No.: US 11,067,754 B2
(45) Date of Patent: Jul. 20, 2021

(54) SIMULTANEOUS ELECTRICAL AND OPTICAL CONNECTIONS FOR FLIP CHIP ASSEMBLY

(71) Applicant: Massachusetts Institute of Technology, Cambridge, MA (US)

(72) Inventors: Lionel C. Kimerling, Concord, MA (US); Jurgen Michel, Arlington, MA (US); Anuradha M. Agarwal, Weston, MA (US); Kazumi Wada, Lexington, MA (US); Drew Michael Weninger, Cambridge, MA (US); Samuel Serna, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/989,448

(22) Filed: Aug. 10, 2020

(65) Prior Publication Data

US 2021/0109290 A1   Apr. 15, 2021

Related U.S. Application Data

(60) Provisional application No. 63/029,198, filed on May 22, 2020, provisional application No. 62/915,057,
(Continued)

(51) Int. Cl.
*G02B 6/30* (2006.01)
*G02B 6/12* (2006.01)
(Continued)

(52) U.S. Cl.
CPC ......... *G02B 6/305* (2013.01); *G02B 6/12004* (2013.01); *G02B 6/4228* (2013.01); *G02B 6/43* (2013.01)

(58) Field of Classification Search
CPC ................ G02B 6/12004; G02B 6/1223; G02B 6/1228; G02B 6/132; G02B 6/136;
(Continued)

(56) References Cited

U.S. PATENT DOCUMENTS 6,810,190 B2   10/2004   Manolatou
6,888,984 B2   5/2005   Abeles et al.
(Continued)

FOREIGN PATENT DOCUMENTS

EP   3091379 A1   11/2016
EP   1706767 B1   6/2019
(Continued)

OTHER PUBLICATIONS

International Search Report and Written Opinion in International Patent Application No. PCT/US2020/045623 dated Dec. 21, 2020, 7 pages.
(Continued)

*Primary Examiner* — Michael P Mooney
(74) *Attorney, Agent, or Firm* — Smith Baluch LLP

(57) ABSTRACT

Optical interconnects can offer higher bandwidth, lower power, lower cost, and higher latency than electrical interconnects alone. The optical interconnect system enables both optical and electrical interconnection, leverages existing fabrication processes to facilitate package-level integration, and delivers high alignment tolerance and low coupling losses. The optical interconnect system provides connections between a photonics integrated chip (PIC) and a chip carrier and between the chip carrier and external circuitry. The system provides a single flip chip interconnection between external circuitry and a chip carrier using a ball grid array (BGA) infrastructure. The system uses graded index (GRIN) lenses and cross-taper waveguide couplers to optically couple components, delivers coupling losses of less
(Continued)

FIG. 1A than 0.5 dB with an alignment tolerance of ±1 μm, and accommodates a 2.5× higher bandwidth density.

33 Claims, 18 Drawing Sheets

Related U.S. Application Data filed on Oct. 15, 2019, provisional application No. 62/913,097, filed on Oct. 9, 2019.

(51) Int. Cl.
  *G02B 6/43* (2006.01)
  *G02B 6/42* (2006.01)

(58) Field of Classification Search
  CPC ........ G02B 6/14; G02B 6/305; G02B 6/4228; G02B 6/43
  USPC .......... 385/14, 33–34, 39, 43, 49–51, 88–92
  See application file for complete search history.

(56) References Cited

U.S. PATENT DOCUMENTS

| | | | |
|---|---|---|---|
| 6,931,180 B2 | 8/2005 | Madsen et al. | |
| 6,957,007 B2 | 10/2005 | Balch et al. | |
| 7,103,245 B2 | 9/2006 | Lee et al. | |
| 7,120,335 B2 | 10/2006 | Agarwal et al. | |
| 7,298,941 B2 * | 11/2007 | Palen | G02B 6/30 385/33 |
| 8,285,092 B2 | 10/2012 | Deki et al. | |
| 8,615,148 B2 | 12/2013 | Chen et al. | |
| 9,188,710 B2 * | 11/2015 | Ho | G02B 3/02 |
| 9,995,895 B2 * | 6/2018 | Hofrichter | G02B 6/34 |
| 2002/0031296 A1 | 3/2002 | Lee et al. | |
| 2002/0154863 A1 | 10/2002 | Mizuno et al. | |
| 2005/0036738 A1 | 2/2005 | Zhou et al. | |
| 2005/0069259 A1 | 3/2005 | Tisserand et al. | |
| 2005/0129366 A1 | 6/2005 | Yasaitis | |
| 2006/0239605 A1 | 10/2006 | Palen et al. | |
| 2009/0003770 A1 | 1/2009 | Gill et al. | |
| 2013/0039620 A1 | 2/2013 | Ho et al. | |
| 2016/0252692 A1 | 9/2016 | Hofrichter | |

FOREIGN PATENT DOCUMENTS

| | | |
|---|---|---|
| KR | 20090029548 A | 3/2009 |
| WO | 2002091051 A2 | 11/2002 |
| WO | 2006090028 A1 | 8/2006 |

OTHER PUBLICATIONS

Bashir et al., "A survey of on-chip optical interconnects." ACM Computing Surveys (CSUR) 51.6 (2019): 1-34.

Dangel et al., "Polymer waveguides for electro-optical integration in data centers and high-performance computers." Optics Express 23.4 (2015): 4736-4750.

U.S. Appl. No. 16/734,727, filed Jan. 6, 2020.

Degroot et al., Chip, Module and Board Level SM Integration: Opportunities and Challenges. Dow Corning Presentation Jun. 22, 2016. Accessed at https://mphotonics.mit.edu/microphotonics-center/meeting-presentations-restricted/spring-2016-building-an-industry-part-i/1205-spr16-degroot-chip-module-and-board-1/file. 16 pages.

Dietrich et al., "In situ 3D nanoprinting of free-form coupling elements for hybrid photonic integration." Nature Photonics 12.4 (2018): 241-247.

Van Laere et al., "Compact and highly efficient grating couplers between optical fiber and nanophotonic waveguides." Journal of lightwave technology 25.1 (2007): 151-156.

La Porta et al.,"Silicon photonics packaging for highly scalable optical interconnects." 2015 IEEE 65th Electronic Components and Technology Conference (ECTC). IEEE, 2015. 6 pages.

McNab et al., "Ultra-low loss photonic integrated circuit with membrane-type photonic crystal waveguides." Optics Express 11.22 (2003): 2927-2939.

Nguyen et al., "Silicon-based highly-efficient fiber-to-waveguide coupler for high index contrast systems," Appl. Phys. Lett. 88, 081112 (2006); https://doi.org/10.1063/1.2179129. 4 pages.

PIXAPP. Accessed at https://pixapp.eu on Jul. 16, 2020. 7 pages.

Silicon photonics. Adiabatic optical coupling. IBM Research. Accessed at https://www.zurich.ibm.com/st/photonics/adiabatic.html on Jul. 16, 2020. 4 pages.

Sun et al., "High performance asymmetric graded index coupler with integrated lens for high index waveguides." Applied Physics Letters 90.20 (2007): 201116. 4 pages.

Sun et al., "Impedance matching vertical optical waveguide couplers for dense high index contrast circuits." Optics Express 16.16 (2008): 11682-11690.

\* cited by examiner

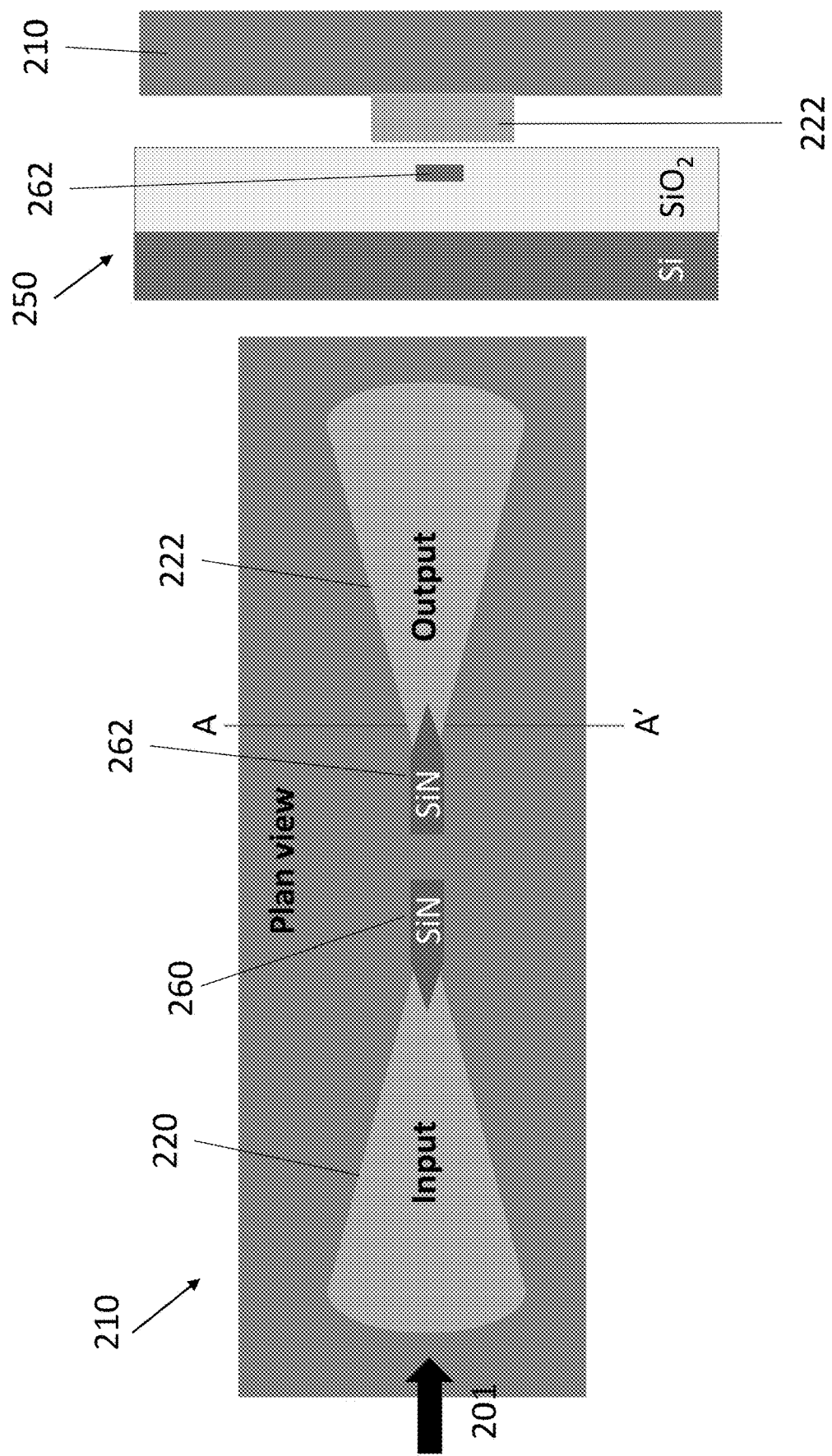

| Parameter | Value |
|---|---|
| Input width | 8μm |
| Lens radius | 9μm |
| Bottom GRIN index | 1.46 |
| Top GRIN index | 1.7 |
| Waveguide width | 1.25μm |
| GRIN height | 6μm |
| Fiber core index | 1.48 |
| Fiber core radius | 4μm |
| Fiber cladding index | 1.45 |
| Second waveguide index | 2 |
| GRIN Taper length | 16μm |
| Second taper length | 60μm |

FIG. 8

SIMULTANEOUS ELECTRICAL AND OPTICAL CONNECTIONS FOR FLIP CHIP ASSEMBLY

CROSS-REFERENCE TO RELATED APPLICATION(S)

This application claims the priority benefit, under 35 U.S.C. § 119(e), of U.S. Application No. 62/913,097, filed on Oct. 9, 2019; U.S. Application No. 62/915,057, filed on Oct. 15, 2019; and U.S. Application No. 63/029,198, filed on May 22, 2020, which are all incorporated herein by reference in their entirety.

BACKGROUND

In recent years, optical device technologies have been implemented more widely in integrated circuitry. A photonic integrated circuit (PIC) is an integrated circuit that uses light to perform several optical functions. PICs use optical waveguides and other optical components to perform these functions. Optical interconnects use light to transmit signals between integrated circuits. These interconnects can be used for intra- and inter-system communication. In certain applications, optical device technologies may offer higher bandwidth, lower power, lower cost, and lower latency than conventional technologies. Recently, optical device technologies have been the subject of study in the fields of high-performance computing and data storage.

Conventional methods of optical interconnection at the chip level use optical fibers. A conventional method of interconnection uses fiber pigtailed couplers. Pigtailed couplers connect optical fibers using splicing. These conventional methods of optical interconnection have several limitations. For example, conventional methods can limit bandwidth density because of the bulkiness of the optical fibers. Conventional optical fibers have a thick cladding surrounding the core to prevent crosstalk between adjacent fibers. The outer diameter of the cladding defines the minimum spacing between adjacent optical fibers coupled to a PIC. Additionally, differences in size and/or refractive index between the optical fiber and waveguides on the PIC can lead to high coupling losses. Conventional methods use high precision alignment to reduce these high coupling losses, but high precision alignment increases fabrication costs, and can reduce ease of adoption. Therefore, there is a need for optical interconnections at the chip level that can increase bandwidth density, decrease coupling losses, and increase alignment tolerance.

SUMMARY

Embodiments of the present technology include a method of making a photonic integrated circuit (PIC) coupled to external circuitry via a chip carrier. The method includes forming a ball grid array on the chip carrier, forming a graded index (GRIN) lens on the chip carrier, forming a first waveguide on the chip carrier, forming a second waveguide in the PIC, integrating the PIC with the chip carrier, and coupling the GRIN lens to an optical waveguide of the external circuitry. The GRIN lens has a curved end, a tapered end, and a refractive index that varies with height. The first waveguide has a first tapered end and a second tapered end, and the first tapered end of the first waveguide is in optical communication with the tapered end of the GRIN lens. The second waveguide also has a tapered end. Integrating the PIC with the chip carrier includes providing optical communication between the tapered end of the second waveguide and the second tapered end of the first waveguide. Integrating the PIC with the chip carrier also includes providing electrical communication between the PIC and the chip carrier via the ball grid array. The curved end of the GRIN lens couples to the optical waveguide of the external circuitry.

Integrating the PIC with the chip carrier may include using flip chip processing. Integrating the PIC with the chip carrier may include aligning the chip carrier and the PIC with a lateral alignment tolerance of ±1 micrometer and a coupling efficiency greater than 95% between the first waveguide and the second waveguide. The method may provide an insertion loss between the optical waveguide of the external circuitry and the GRIN lens of less than 0.5 dB.

Forming the GRIN lens on the chip carrier may include forming a stack of layers. Each layer in the stack of layers may have a different refractive index. The stack of layers may form a cylindrical surface at one end of the GRIN lens and a taper at the other end of the GRIN lens. The layers in the stack of layers may increase in refractive index from a bottom layer to a top layer. The layers in the stack of layers may change in refractive index according to a grading function that is at least one of a linear function or a polynomial function. Each layer in the stack of layers may have a refractive index within the range of about 1.45 to about 5.00.

The method of making a PIC coupled to external circuitry via a chip carrier may further include forming an arrayed waveguide grating on the chip carrier coupled to the first waveguide. The method of making a PIC coupled to external circuitry via a chip carrier may further include forming a third waveguide on the chip carrier, forming a fourth waveguide in a second PIC, and integrating the second PIC with the chip carrier. The third waveguide may have a tapered end. The fourth waveguide may have a tapered end. Integrating the second PIC with the chip carrier may include providing optical communication between the tapered end of the third waveguide and the tapered end of the fourth waveguide.

Additional embodiments of the present technology include a PIC apparatus. The PIC apparatus includes a chip carrier, and a PIC. The chip carrier includes a GRIN lens and a chip carrier waveguide. The GRIN lens has a curved end, a tapered end, and a refractive index that varies with height. The curved end of the GRIN lens is in optical communication with an optical waveguide of an external circuitry. The chip carrier waveguide has a first tapered end and a second tapered end. The first tapered end of the chip carrier waveguide is in optical communication with the tapered end of the GRIN lens. The PIC includes a circuit waveguide. The circuit waveguide has a tapered end. The tapered end of the circuit waveguide is in optical communication with the second tapered end of the chip carrier waveguide.

The PIC apparatus may further include additional components. The GRIN lens in the PIC apparatus may be a first GRIN lens. The optical waveguide of the external circuitry may be a first optical waveguide of the external circuitry. The chip carrier waveguide may be a first chip carrier waveguide. The circuit waveguide may be a first circuit waveguide. The PIC apparatus may further include a second circuit waveguide in the PIC, a second chip carrier waveguide on the chip carrier, and a second GRIN lens. The second circuit waveguide may have a tapered end. The second chip carrier waveguide may have a first tapered end and a second tapered end. The first tapered end of the second chip carrier waveguide may be in optical communication with the tapered end of the second circuit waveguide. The second GRIN lens may have a curved end, a tapered end, and a refractive index that varies with height. The tapered end of the second GRIN lens may be in optical communication with the second tapered end of the second chip carrier waveguide. The curved end of the second GRIN lens may be in optical communication with a second optical waveguide of the external circuitry.

The PIC apparatus may be integrated using flip chip processing. The PIC apparatus may have a lateral alignment tolerance between the chip carrier and the PIC that is ±1 micrometer. The coupling efficiency between the chip carrier waveguide and the circuit waveguide may be greater than 95%. An insertion loss between the optical waveguide of the external circuitry and the GRIN lens may be less than 0.5 dB. The chip carrier waveguide may be a single-mode waveguide.

The GRIN lens may have a stack of layers. Each layer in the stack of layers may have a different refractive index. The layers in the stack of layers may increase in refractive index from a bottom layer to a top layer. The layers in the stack of layers may decrease in refractive index from a bottom layer to a top layer. The layers in the stack of layers may vary in refractive index according to a grading function that is at least one of a linear function or a polynomial function. Each layer in the stack of layers may have a refractive index within the range of about 1.45 to about 5.00. The GRIN lens may include at least one of silicon oxynitride, silicon nitride, silicon-germanium, silicon, silicon dioxide, chalcogenide glass, lead chalcogenide, germanium, or aluminum oxide.

The chip carrier in the PIC apparatus may additionally include an arrayed waveguide grating optically coupled to the chip carrier waveguide. The chip carrier waveguide may include at least one of silicon, silicon-germanium, silicon nitride, polymer, amorphous silicon, or doped silica, chalcogenide glass, lead chalcogenide, germanium, or aluminum oxide. The chip carrier waveguide and the circuit waveguide may comprise different materials. The chip carrier waveguide and the circuit waveguide may comprise the same material. The chip carrier waveguide may have a refractive index of about 1.5 to about 5. The optical waveguide of the external circuitry may be at least one of an optical fiber or a waveguide. The chip carrier may further include a cladding comprising at least one of silicon dioxide, silicon oxynitride, polymer, aluminum oxide, or chalcogenide glass. The chip carrier may further include a readout integrated circuit.

The PIC apparatus may transmit light in a wavelength range of 1260 nm to 1675 nm. The PIC apparatus may transmit light in a wavelength range of 3000 nm to 8000 nm. The PIC apparatus may transmit light in a wavelength range of 8000 nm to 15,000 nm.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

FIG. 2A shows a plan view of two tapered graded index lenses optically coupled to two waveguides.

FIG. 2B shows a profile view of the two tapered graded index lenses optically coupled to two waveguides shown in FIG. 2A.

FIG. 8 shows the parameters of a tapered graded index lens and an optical fiber used to generate the results shown in FIGS. 9-11.

DETAILED DESCRIPTION

Figure 1A:
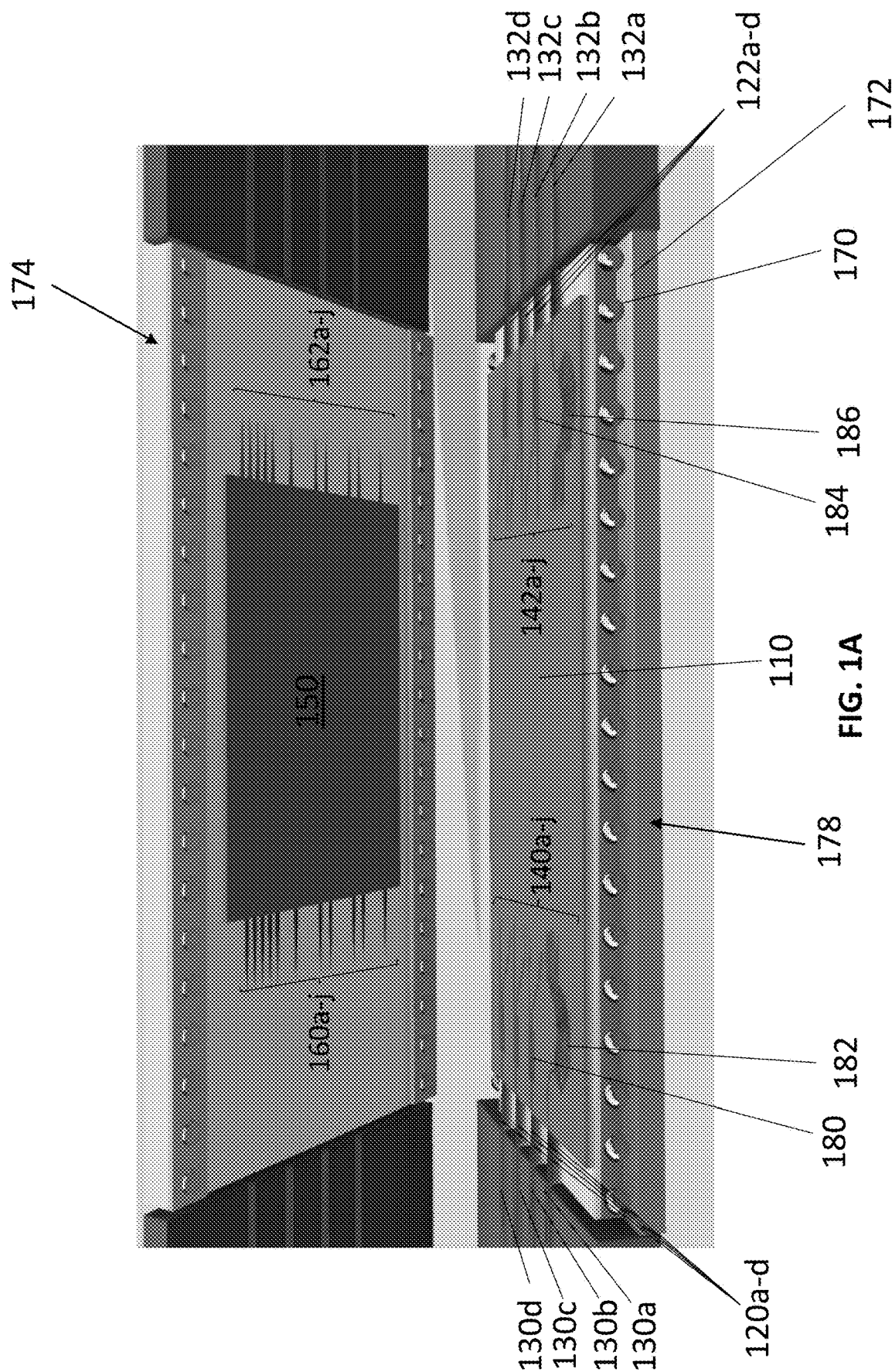
FIG. 1A shows a schematic of a photonic integrated circuit above a chip carrier with various couplers.

One of the challenges to widespread adoption of new optical device interconnection technologies is the difficulty of PICs into existing frameworks. Integration of optical interconnection technology can be eased when CMOS processes and tools are used. The optical interconnect system described herein leverages existing semiconductor fabrication processes and tools to facilitate adoption of PICs and optical interconnection.

As bandwidth density increases, there is a growing need for better interconnection at the package level that can be integrated using existing semiconductor fabrication processes and tools. Optical interconnects can offer higher bandwidth, lower power, lower cost, and lower latency than electrical interconnects alone. Furthermore, co-packaging electrical and optical interconnects can offer further performance benefits. Adoption of optical interconnects has been hampered by conventional optical interconnect technologies, which rely on difficult fabrication and assembly processes and therefore may not effectively harness the potential benefits of the technology. The present optical interconnect technology enables both optical and electrical interconnection, leverages existing fabrication processes to facilitate package-level integration, and delivers high tolerance to misalignment.

The present optical interconnects can be implemented in a CMOS-compatible system that connects a PIC to a chip carrier and connects the chip carrier to external circuitry. The system leverages the ball grid array (BGA) infrastructure of electronics to provide electrical connection and mechanical integration and provides higher density and mechanical reliability than conventional photonic interconnects, such as fiber pigtails. The PIC and chip carrier can be coupled with a single flip chip interconnection. This system provides small pitch edge-coupled optical waveguide connections between the chip carrier and external circuitry. Optical fanout to board-level waveguides can be surface mounted at the solder reflow step.

The optical interconnect system includes high-throughput packaging for optical input/output (I/O) communication. The system allows for wide alignment tolerance for connections between chip and chip carrier and between chip carrier and optical fiber. The system can be used in a fiber-free architecture for PIC-to-PIC interconnection. The architecture accommodates electronic-photonic integration and optical fanout with wide alignment tolerance and low loss optical interfaces. One performance Figure of Merit (FoM) that can be used to guide design is (Bandwidth Density) x (Alignment Tolerance)/(Coupling Loss). Photonic integration provides high bandwidth density using more densely packed optical connections. Assembly can be cost effective by using packaging solutions that are compatible with CMOS reflow (275° C.) processes and with pick-and-place tools.

A GRIN structure couples light between external circuitry and the chip carrier. The GRIN structure may be optically coupled to an optical fiber or waveguide integrated with the external circuitry. The GRIN structure may include or be a GRIN lens, which combines a cross-taper coupler with a lensed GRIN spacer and fiber interface. Optical impedance at the interface is matched using a cross-taper structure. The refractive index and light mode at the optical fiber interface are matched using a GRIN lens attached to the chip carrier. The GRIN lens is dimensionally compatible with the edge of the I/O pitch and the thickness of the BGA. The GRIN lens provides managed mode confinement in the coupler and mode expansion with refractive index matching at the fiber interface.

Earlier attempts to integrate GRIN structures into PICs were largely unsuccessful because of the GRIN structure's height constraint. In order to integrate a GRIN structure into a PIC, a trench deep enough to accommodate the height of the GRIN structure is etched into the PIC. This trench can be several micrometers deep (e.g., about 9 microns deep) and was deemed too large to justify integrating GRIN structures into other photonic chips.

The present technology takes advantage of the trench structures used to contain solder balls that are already present in a BGA. The solder balls are typically 10 to 20 microns in diameter define the minimum height of the BGA trench. A trench deep enough or sidewall tall enough to accommodate a BGA can readily accommodate the height of 9-micron-tall GRIN structure. Furthermore, the height of the trench structure, the size of the solder balls, and the height of the GRIN structures can be controlled to provide better alignment between the chip carrier and the PIC.

Cross-taper waveguide couplers can be used to optically couple the chip carrier and one or more PICs. The cross-taper waveguide couplers act as optical pins to couple light between two waveguides using tapered structures at the ends of the waveguides. An overlap of the tapered structures provides optical coupling, where a propagating mode is coupled via effective index coupling. The cross-taper couplers effectively match optical impedance, suppress power oscillation, and allow for a high misalignment tolerance during fabrication and assembly. A waveguide can have cross-taper structures on both ends or on only one end. One tapered coupler can be in the PIC and the other tapered coupler can be on the chip carrier. The tapered coupler in the PIC may terminate at the edge of the PIC. Alternatively, the tapered coupler in the PIC may terminate near the center of the PIC. A waveguide on the chip carrier with tapered couplers at each end can provide coupling to the PIC and to the GRIN lens.

The cross-taper coupler is compatible with pick-and-place systems and with BGA reflow processing. The cross-taper coupler includes two or more optical interfaces, each of which inserts less than 0.5 decibels (dB) of loss with an alignment tolerance of ±1 µm. The cross-taper couplers can be designed to increase impedance match. The cross-taper couplers can also be designed to increase performance based on other characteristics, such as refractive index differences, coupler overlap, alignment tolerance, or coupling losses. Designing for a particular parameter may engender trade-offs. For example, designing a more robust alignment tolerance may correspond with a higher coupling loss. Dimensions of the couplers and materials used for the couplers can be chosen appropriately for different designs. For example, a wider coupler expands the alignment tolerance but also expands the size of the footprint. A coupler made from a lower index material can also effectively expand the alignment tolerance but can also increase coupling losses.

The present technology provides high bandwidth density using more densely packed optical connections. The density of conventional optical connections is constrained by the standard spacing between optical fiber connections used to reduce crosstalk between adjacent fibers. Conventional fibers are typically constrained to 125 µm pitches based on the outer diameter of the fiber's cladding. The center to center spacing between optical fibers attached to the chip carrier is constrained by the outer cladding diameter of each fiber because the fibers are physically separate. In conventional systems, this constraint is usually transferred to the PIC as well. The present technology overcomes this constraint by connecting optical fibers to the chip carrier instead of the PIC. The waveguides on the PIC can be spaced much closer that would otherwise be possible. Therefore, the present technology improves bandwidth density by integrating optical fiber connections at the chip carrier level and using cross-taper couplers to couple the chip carrier to the PIC. Because the cross-taper couplers can accommodate a pitch of 25 μm, the PIC can accommodate a 2.5× higher bandwidth density.

Figure 1B:
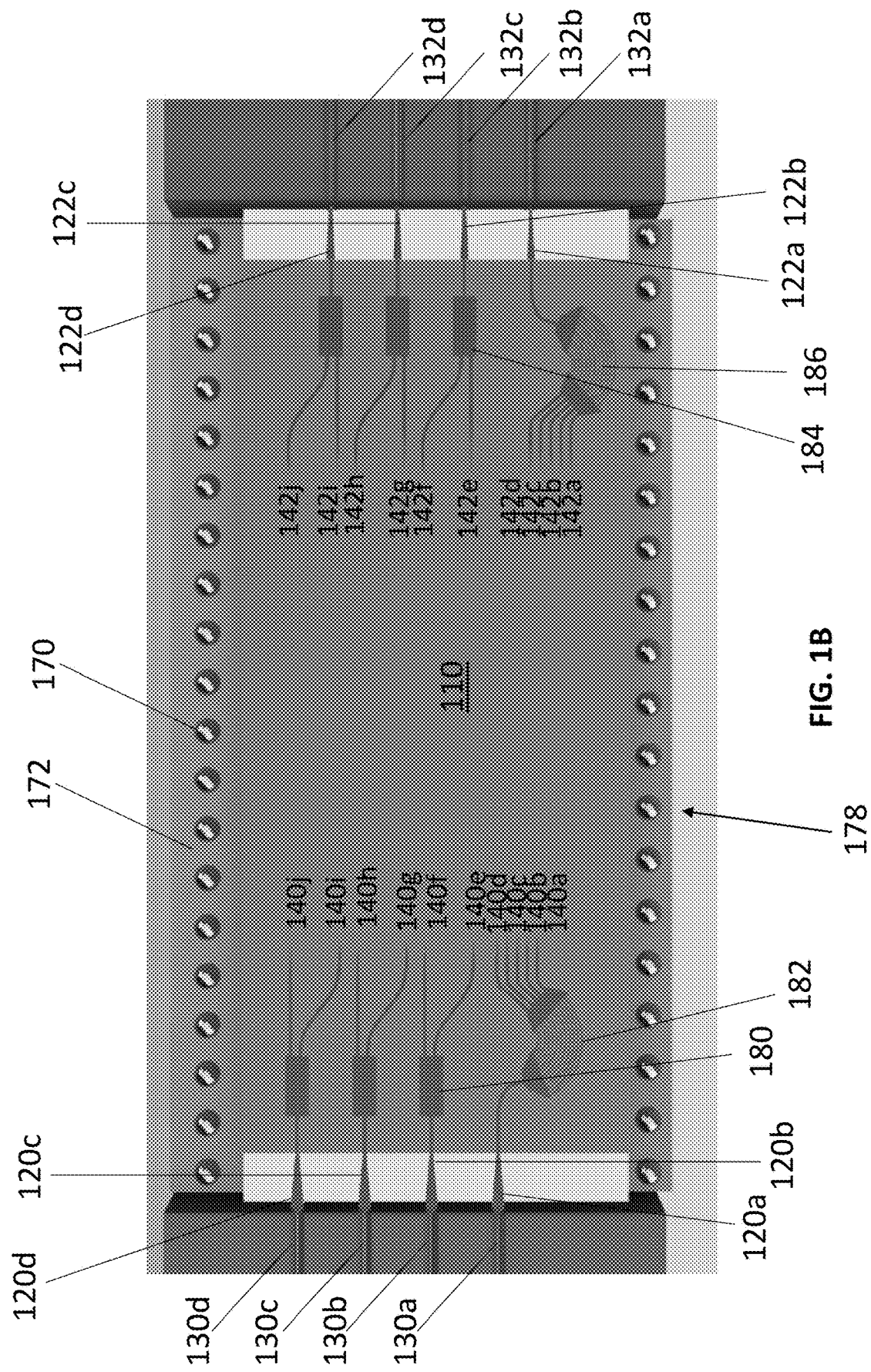
FIG. 1B shows another view of the photonic integrated circuit and chip carrier in FIG. 1A.

FIGS. 1A and 1B show a schematic of optical interconnect technology that integrates both electrical and optical connections and delivers high alignment tolerance and low coupling losses. The optical interconnect technology provides connections between a chip carrier 110 and a PIC 150, as well as connections between the chip carrier 110 and external circuitry waveguides 130a-130d and 132a-132d (collectively, waveguides 130 and 132, respectively).

On one side of the chip carrier, there are one or more GRIN lenses 120a-120d (collectively, GRIN lenses 120) on the chip carrier 110 that are optically coupled to respective waveguides 130, which may be optical fibers or other waveguides. The optical fibers 130 may be placed within V-grooves that align the optical fibers and the GRIN lenses 120. The optical fibers 130 can have conventional cylindrical shapes. Alternatively, the optical fibers 130 may have flatter rectangular shapes or elliptical shapes, where the flatter shapes may more easily align and attach to a planar chip carrier and thereby create a more robust fiber to chip connection. The GRIN lenses 120 are optically coupled via cross-taper couplers to waveguides 140a-140j (collectively, waveguides 140) on the chip carrier 110. The waveguides 140 may include additional couplers or beam splitter structures, such as splitters 180 or arrayed wavelength gratings (AWGs) 182 to split, combine, or multiplex signals. The waveguides 140 are optically coupled to waveguides 160a-160j in the PIC 150 via cross-taper couplers to guide light into the PIC 150.

On another side of the chip carrier, the system 100 includes waveguides 162a-162j (collectively, waveguides 162) in the PIC 150 coupled to waveguides 142a-142j (collectively, waveguides 142) on the chip carrier 110 via cross-taper couplers (described below) that guide light between the PIC 150 and the chip carrier 110. The waveguides 160 and 162 in the PIC 150 are depicted in FIG. 1A as extending beyond the edges of the PIC 150 for illustration purposes but remain contained within the boundaries of the PIC. Waveguides 142 on the chip carrier 110 may optionally include additional couplers or beam splitter structures, such as splitters 184 or AWGs 186, to split, combine, or multiplex signals. The waveguides 142 are optically coupled to GRIN lenses 122a-122d (collectively, GRIN lenses 122) on the chip carrier 110 via cross-taper couplers (not pictured). The GRIN lenses 122 are optically coupled to external circuitry to transmit light between the optical interconnect system 100 and external circuitry. The external circuitry optically coupled to GRIN lens 122 may include or be integrated with optical fibers 132 or waveguides.

The waveguides and other light-guiding structures shown in FIGS. 1A and 1B can be configured to guide light bidirectionally or in one direction only. In the configuration where light propagates bidirectionally (e.g., simultaneously), GRIN lenses 120 and GRIN lenses 122 may have the same refractive index grading (e.g., low refractive index on the bottom and high refractive index on top). This configuration is more easily fabricated than a configuration where GRIN lenses 120 and 122 have different index gradings. In addition to using refractive index changes to direct the propagation of light, this configuration takes advantage of mode beating using specific structure geometries. In the configuration where light propagates primarily in one direction, GRIN lenses 120 effectively receive optical signals from external circuitry 130 and GRIN lenses 122 effectively transmit optical signals to external circuitry 132. In this configuration, the refractive index gradings in GRIN lenses 120 and GRIN lenses 122 are different, and the changing refractive index is used to guide light through the chip carrier 110 and the PIC 150. For example, the GRIN lenses 120 on one side of the chip carrier 110 have refractive indices that increase from low (e.g., about 1.5) to intermediate (e.g., 2.4) values, the waveguides on the chip carrier 110 and PIC 150 have intermediate values, and the GRIN lenses 122 range from intermediate values for the top layers of the GRIN lenses 122 to high (e.g., over 3) values at the bottom layers of the GRIN lenses 122.

The optical interconnect system includes a BGA 178 to provide electrical interconnection between the chip carrier 110 and the PIC 150. The BGA 178 also provides mechanical connections between the chip carrier 110 and the PIC 150. Prior to assembly, the BGA 178 includes solder balls 170 on the chip carrier, metal pads 174 on the underside of the PIC and a trench structure 172 in the chip carrier. During assembly, surface tension in the molten solder bumps 170 align to metal pads 174, thereby aiding alignment of optical connections between the chip carrier 110 and the PIC 150. The chip carrier 110 can be electrically connected to external circuitry using a readout integrated circuit (ROIC) in the underside of the chip carrier, with electrical connections made using through-silicon vias (TSVs).

Before the PIC 150 is mounted on the chip carrier 110, the chip carrier 110 is assembled with solder balls 170 arranged in an array and the PIC 150 is assembled with metal pads 174 arranged in a pattern that matches the solder balls 170. The solder balls 170 are arranged in a trench structure 172 that can be used to control the spacing between the PIC 150 and the chip carrier 110. The trench structures are about 300 μm to about 400 μm deep. The spacing between the PIC 150 and the chip carrier 110 is about 150 nm to about 500 nm, and preferably less than 200 nm. The space between the PIC 150 and the chip carrier 110 can be filled with one or more gasses or with index matching fluid.

FIGS. 2A and 2B show plan and cross-sectional views, respectively, schematics of GRIN lenses on a chip carrier 210 directly coupled to waveguides on a PIC 250. FIG. 2B shows a cross-sectional view of the schematic shown in FIG. 2A at the line A to A'. These structures are depicted in FIGS. 2A and 2B as guiding light in one direction but may alternatively guide light bidirectionally. The directionality of light is imprinted during fabrication of the structure and is defined by use-case scenarios. On the input side, light 201 from external circuitry is effectively transmitted into the input GRIN lens 220, which couples light into waveguide 260 in the PIC 250 via cross-taper couplers. Alternatively, one or more additional layers can exist between the GRIN lens 220 and the waveguide 260 in the PIC 250, and additional waveguides and cross-taper couplers can be used to couple light between these layers. On the output side, light is coupled from the waveguide 262 in the PIC 250 to output GRIN lens 222 on the chip carrier, where it can be transmitted from the GRIN lens 222 to external circuitry. The waveguides 260 and 262 are surrounded by cladding with a lower refractive index. For example, the waveguides can be silicon nitride with a refractive index of about 1.91 and the cladding can be silicon dioxide with a refractive index of about 1.45. These nitride and silica materials can be used in datacom and telecom applications, visible wavelength applications, and mid-infrared applications up to wavelengths of about 4 μm. Other materials with higher refractive indices up to a refractive index of about 5.0 can be used for longer wavelength applications. These materials include chalcogenides, silicon germanium, and germanium.

Figure 3A:
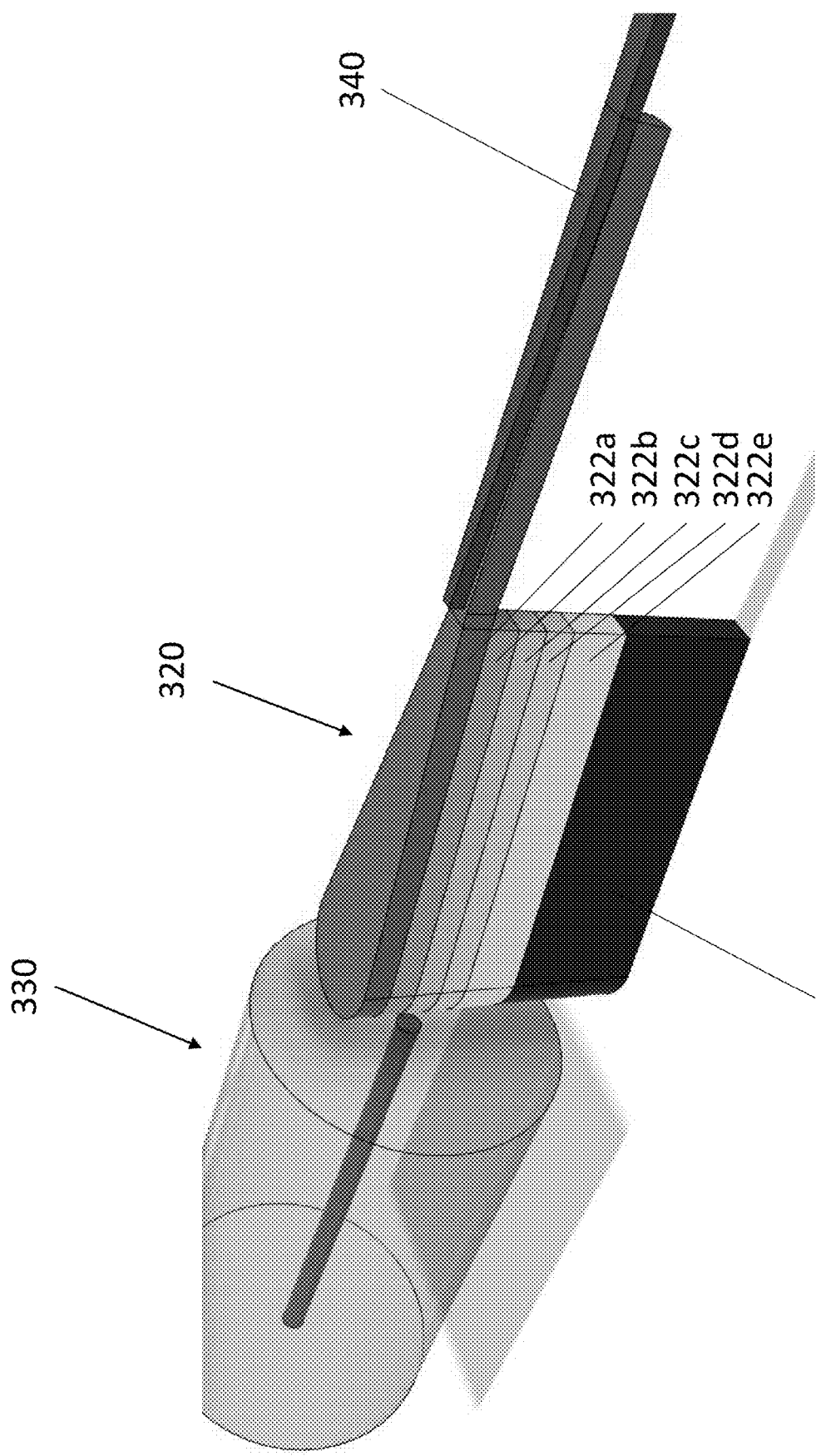
FIG. 3A shows an input tapered graded index lens from FIG. 1A with a vertically increasing refractive index optically coupled to an optical fiber on one end and a waveguide on the other end.

FIG. 3A shows a schematic of a GRIN lens 320 on a substrate 310 optically coupled to an optical fiber 330 on one end and optically coupled to a waveguide 340 on the other end. In the configuration where optical signal propagates primarily in one direction, the GRIN lens 320 is an input GRIN lens that efficiently transmits the optical signal from the fiber to waveguide 340. Alternatively, in the configuration where optical signals propagate bidirectionally, the GRIN lens 320 guides optical signals bidirectionally. In the configuration where optical signal can propagate bidirectionally, GRIN lens 320 has the same index grading as both GRIN lenses 120 and 122 in FIGS. 1A and 1B.

The GRIN lens 320 has a linearly increasing refractive index grading that increases with the height or thickness of the structure. The GRIN lens 320 in FIG. 3A is an exemplary model that has five layers 322a-322e, each with a different refractive index. As an example, from this perspective, the lowest layer 322e can be silicon oxide with a refractive index of 1.45, and the highest layer 322a can be silicon nitride, silicon, silicon germanium, or germanium with a refractive index between 2.0 and 4.0. Other versions of the GRIN lens 320 can have more or fewer layers. Alternatively, the GRIN lens 320 can have a continuously graded index, e.g., by changing the stoichiometry of the GRIN lens material, instead of distinct layers. Instead of a linear grading, the grading in the GRIN lens 320 can alternatively follow a parabolic index profile or other polynomial function index profile. The GRIN lens 320 can be surrounded by an oxide cladding or an air gap.

Figure 3B:
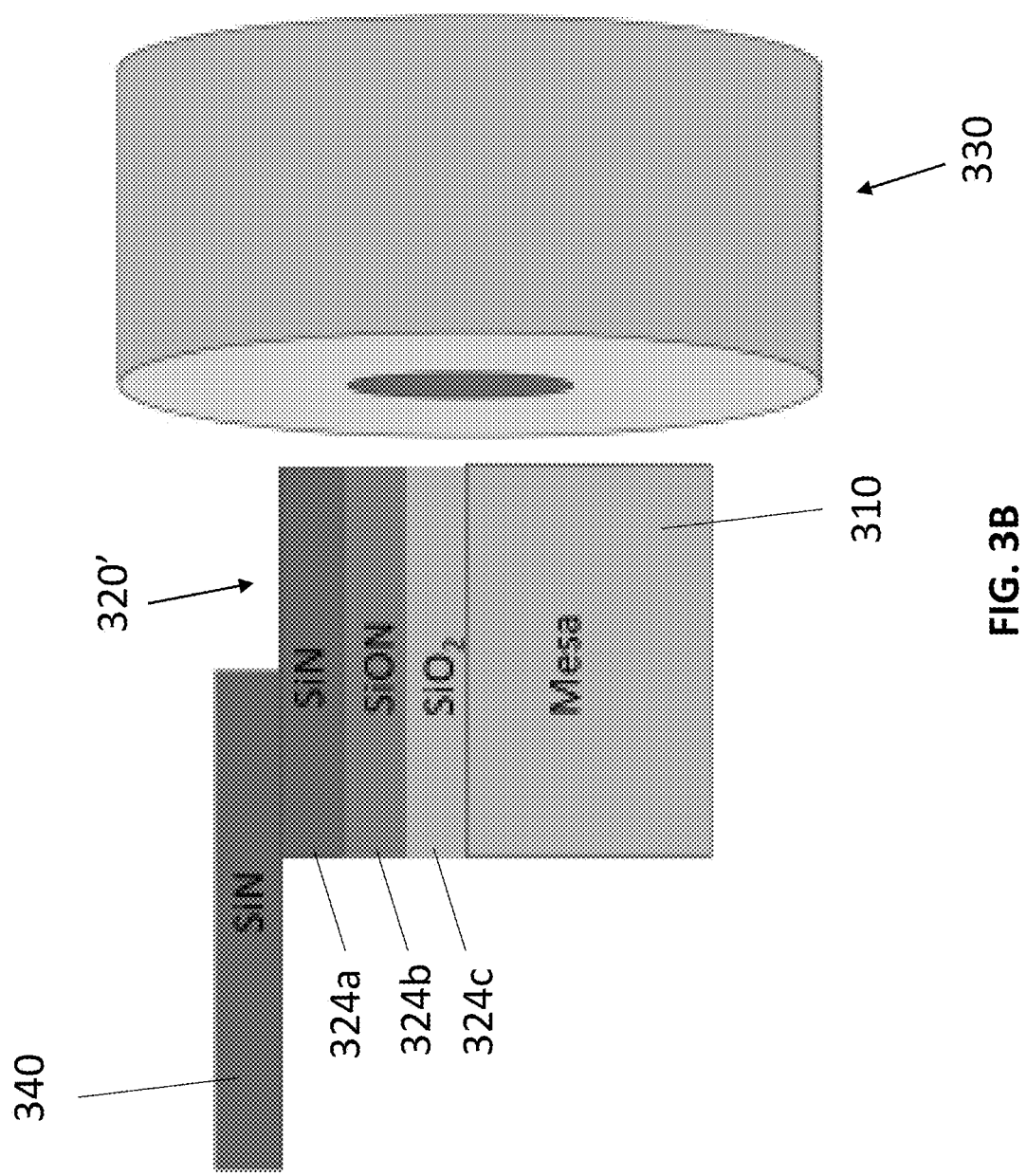
FIG. 3B shows a side view of the tapered graded index lens coupled to an optical fiber and a waveguide shown in FIG. 3A.

FIG. 3B shows a side view of an input GRIN lens 320' optically coupled to an optical fiber 330 and a waveguide 340. The index grading structure may be constructed using layers of different materials 324a-324c with different refractive indices (n). For example, the GRIN lens may include three different materials, with a bottom layer 324c of silicon dioxide (n=1.45), a middle layer 324b of silicon oxynitride (n=1.8 to 2.3), and a top layer 324a of silicon nitride (n=3.45). The GRIN lens structure may alternatively include silicon-germanium (n=3.45 to 4.00) as the top layer 324a.

Figure 3C:
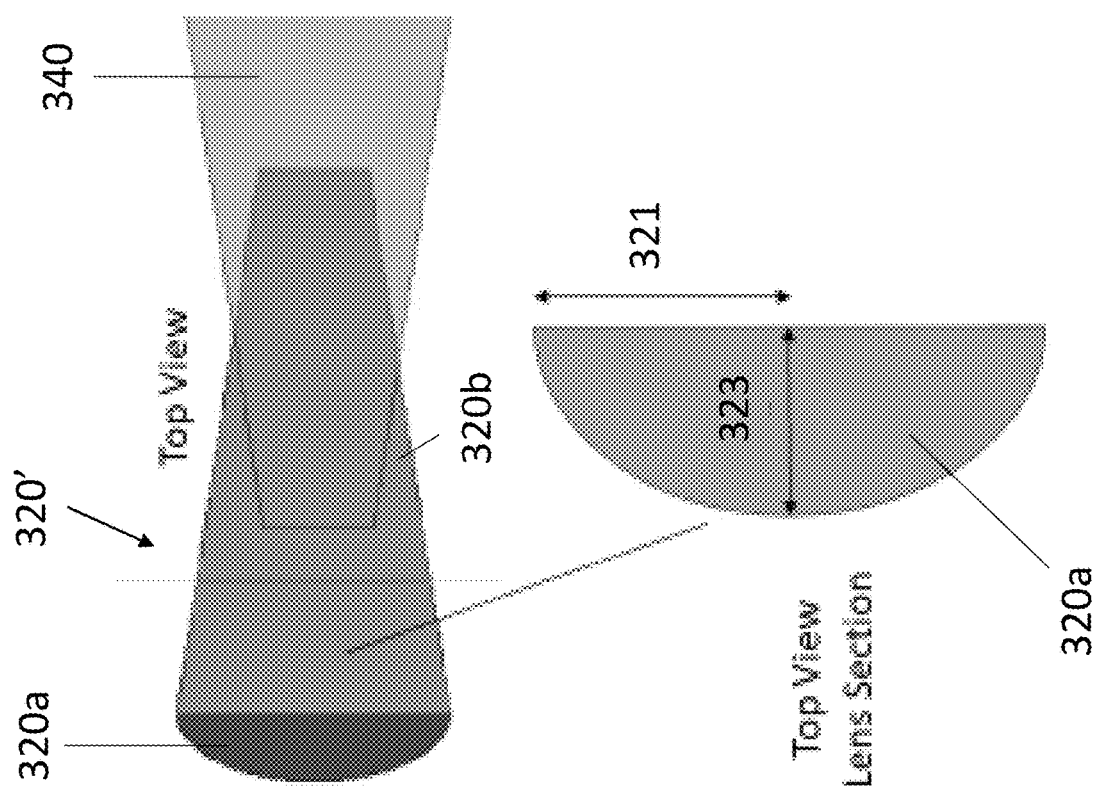
FIG. 3C shows a top view of the tapered graded index lens coupled to a waveguide shown in FIG. 3A.
Figure 3D:
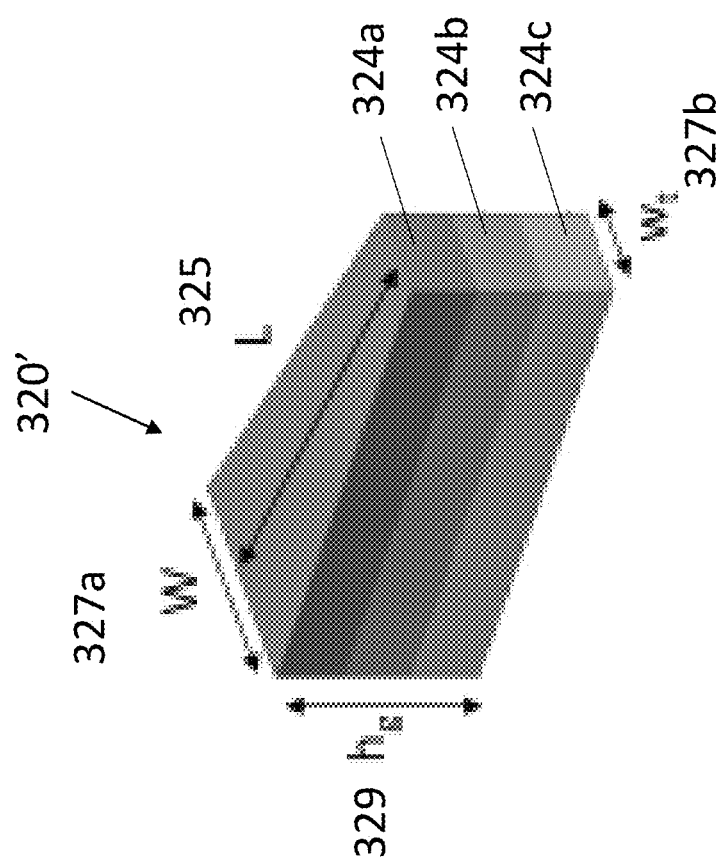
FIG. 3D shows the tapered section of the tapered graded index lens shown in FIG. 3A.

FIG. 3C shows a top down view of the input GRIN lens 320' optically coupled to a waveguide 340. The GRIN lens 320' includes a curved (here, semi-cylindrical) lens portion 320a and a tapered trapezoidal portion 320b. The lens portion 320a helps couple light from the optical fiber 330 into the GRIN lens 320'. The lens portion 320a has dimension 321 and lens radius 323. The tapered portion 320b acts as a cross-taper coupler to couple the GRIN lens 320' to a waveguide either on a chip carrier or in a PIC. FIG. 3D shows a perspective view of the tapered portion 320b of a GRIN lens 320'. The tapered portion 320b has a length 325, input width 327a, taper width 327b, and a height 329. As an example, the GRIN lens 320' has a lens radius 323 of 9 μm, an input width 327a of 8 μm, a taper length 325 of 16 μm, a taper width 327b of 1.25 μm, and a height 329 of 6 μm. In this example, the bottom layer 324c has a refractive index of 1.46, the top layer 324a has an index of 1.7, and the grading profile linearly increases.

The GRIN lens 320' couples light between the optical fiber 330 and the waveguide 340 on a chip carrier with low coupling losses. Light from the optical fiber 330 is confined by the lens portion 320a to the tapered portion 320b. To guide light from the optical fiber 330 to the waveguide 340 on a chip carrier, the index grading guides light from the lowest index layer to the highest index layer within the GRIN lens 320'. The tapered portion 320b provides lateral confinement for optical impedance matching with the waveguide 340. To guide light from the waveguide 340 to the optical fiber 330, the geometry of the GRIN lens 320 is designed to take advantage of mode beating.

Figure 4:
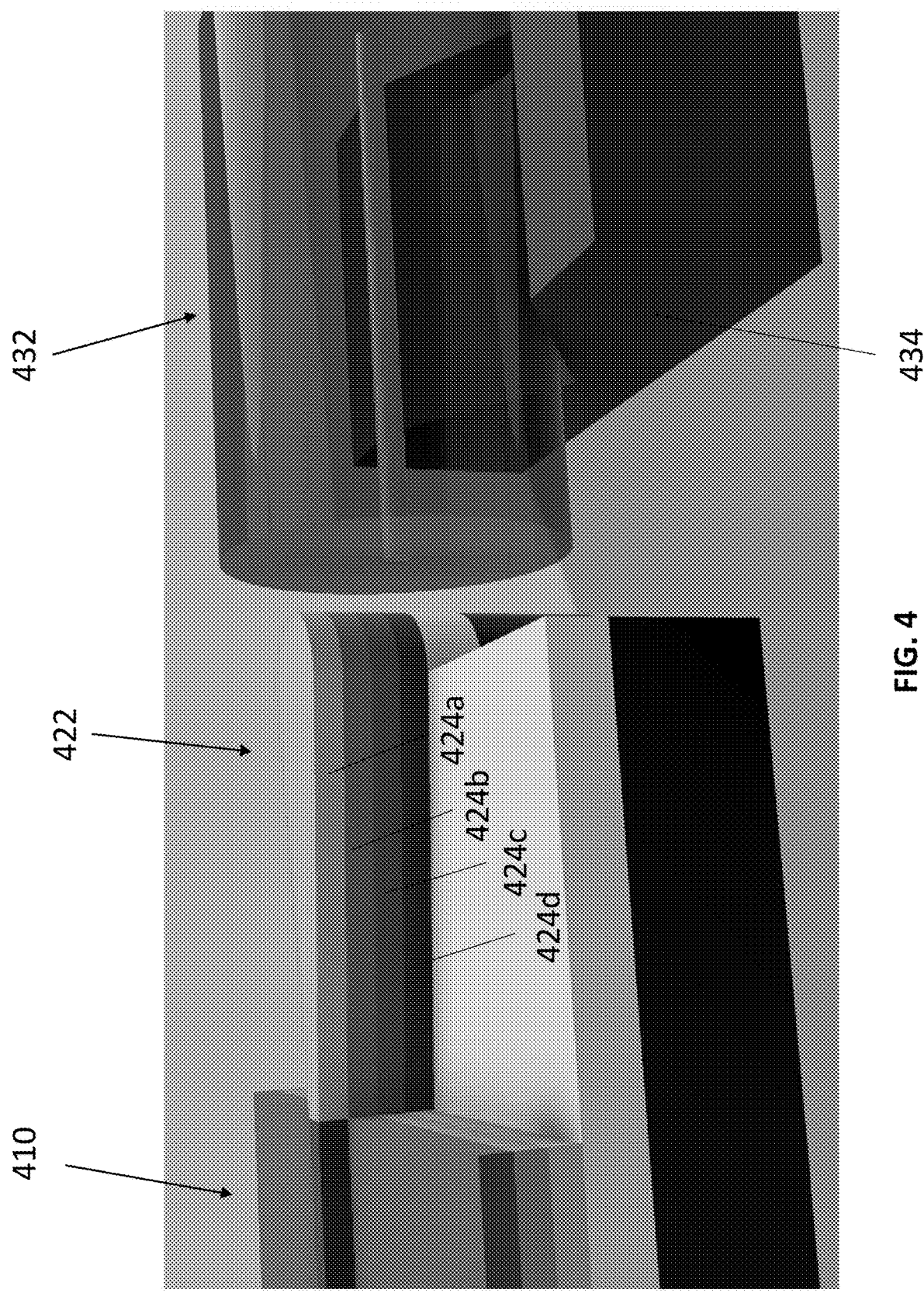
FIG. 4 shows an output tapered graded index lens from FIG. 1A with a vertically decreasing refractive index optically coupled to an optical fiber.

FIG. 4 shows a schematic of a GRIN lens 422 on a chip carrier 410 and optically coupled to an optical fiber 432 placed within a V-groove 434. The GRIN lens 422 is used in the configuration designed to guide light primarily in one direction. The GRIN lens 422 efficiently transmits the optical signal from the chip carrier 410 to the optical fiber 432. The output GRIN lens 422 has a similar shape and dimensions to the input GRIN lens 420 and operates using similar principles. The GRIN lens 422 has a linearly decreasing refractive index grading that decreases with the height of the structure. The GRIN lens 422 in FIG. 4 is an exemplary model that has four layers 424a-424d, each with a different refractive index. As an example, from the perspective in FIG. 4, the highest layer 424a can be crystalline silicon and the lowest layer 424d can be silicon germanium or germanium, and the refractive index increases with increasing germanium concentration. As another example, the highest layer 424a can be silicon nitride and the lowest layer 424d can be silicon, and the refractive index increases with increasing silicon concentration. Alternatively, the layers 424a to 424d can be chalcogenide materials. The tear-drop geometry of the GRIN lens 422 may increase the mode size and reduce the footprint. Alternatively, the GRIN lens 422 can use an inverse taper geometry to expand the mode and decrease the effective refractive index of the mode, such as that shown in FIG. 5. As another alternative, the GRIN lens 422 can have a parabolic index profile or other polynomial function index profile. Other versions of the GRIN lens 422 can have an arbitrary number of layers. Alternatively, the GRIN lens 422 can have a graded change in stoichiometry instead of distinct layers.

Figure 5:
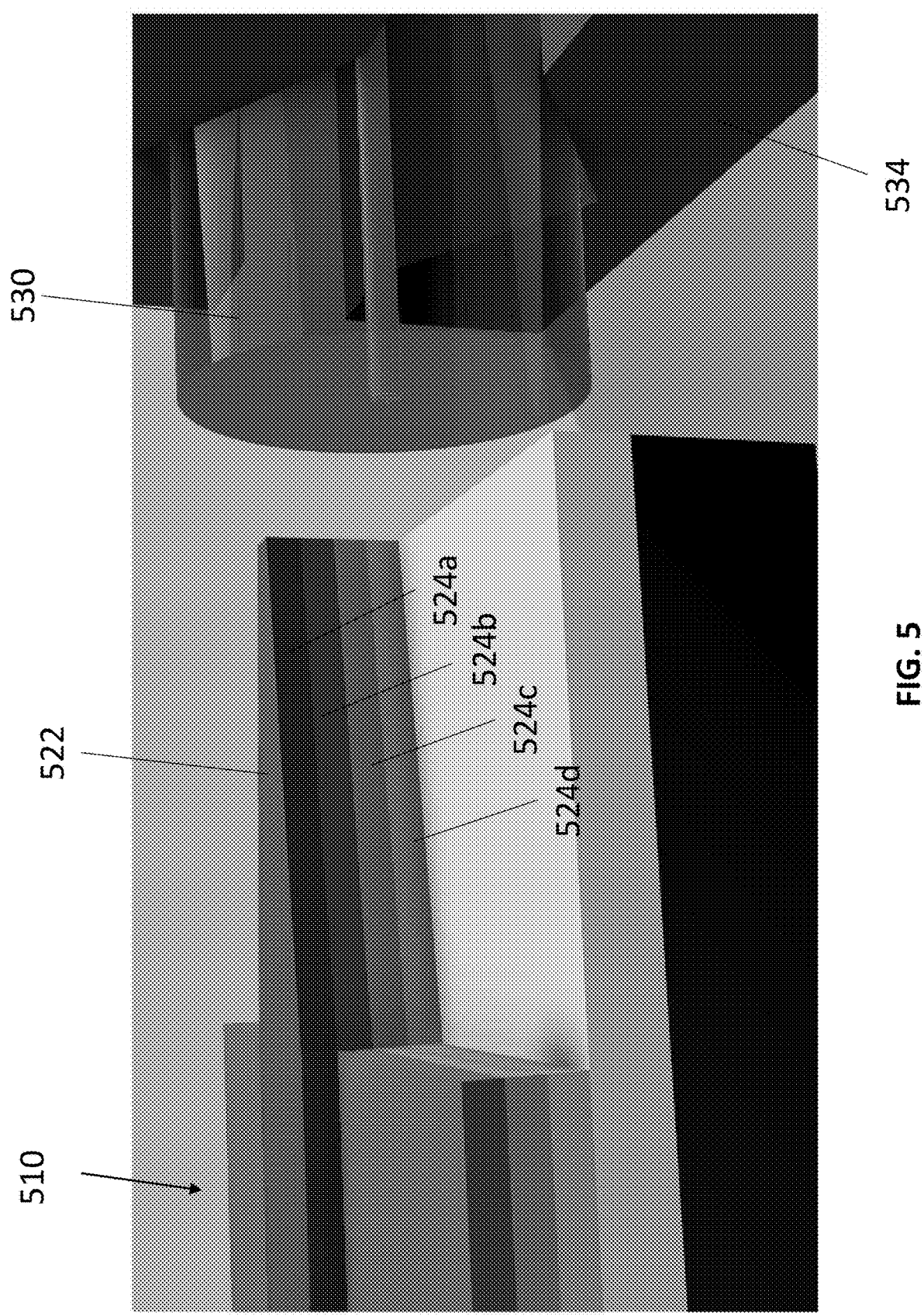
FIG. 5 shows an alternate version of the graded index lens from FIG. 1A optically coupled to an optical fiber.

FIG. 5 shows a schematic of an alternative GRIN lens 522 on a chip carrier 510 and optically coupled to an optical fiber 530 placed within a V-groove 534. The GRIN lens has a linearly increasing refractive index grading that increases with the height of the structure. The exemplary model of the GRIN lens 522 in FIG. 5 has four layers 524a-524d, each with a different refractive index. As an example, from the perspective shown in FIG. 5, the highest layer 524a can be silicon nitride, silicon, silicon germanium, or germanium with a refractive index between 2.0 and 4.0 and the lowest layer 524d can be silicon oxide with a refractive index of 1.45. Alternatively, the GRIN lens 522 can have more or fewer layers. Alternatively, the GRIN lens 522 can have a continuously graded index, e.g., by changing the stoichiometry of the GRIN lens material, instead of distinct layers. Instead of a linear grading, the grading in the GRIN lens 522 can alternatively follow a parabolic index profile or other polynomial function index profile. The GRIN lens 522 can be surrounded by an oxide cladding or an air gap. The GRIN lens 520 is tapered to provide lateral confinement at the end abutting the fiber 530. Mode beating is used to force light down and out of the GRIN lens 520. This alternative GRIN lens design can be used for both input and output GRIN lenses in a configuration where light propagates bidirectionally. This configuration simplifies processing and assembly.

Figure 6:
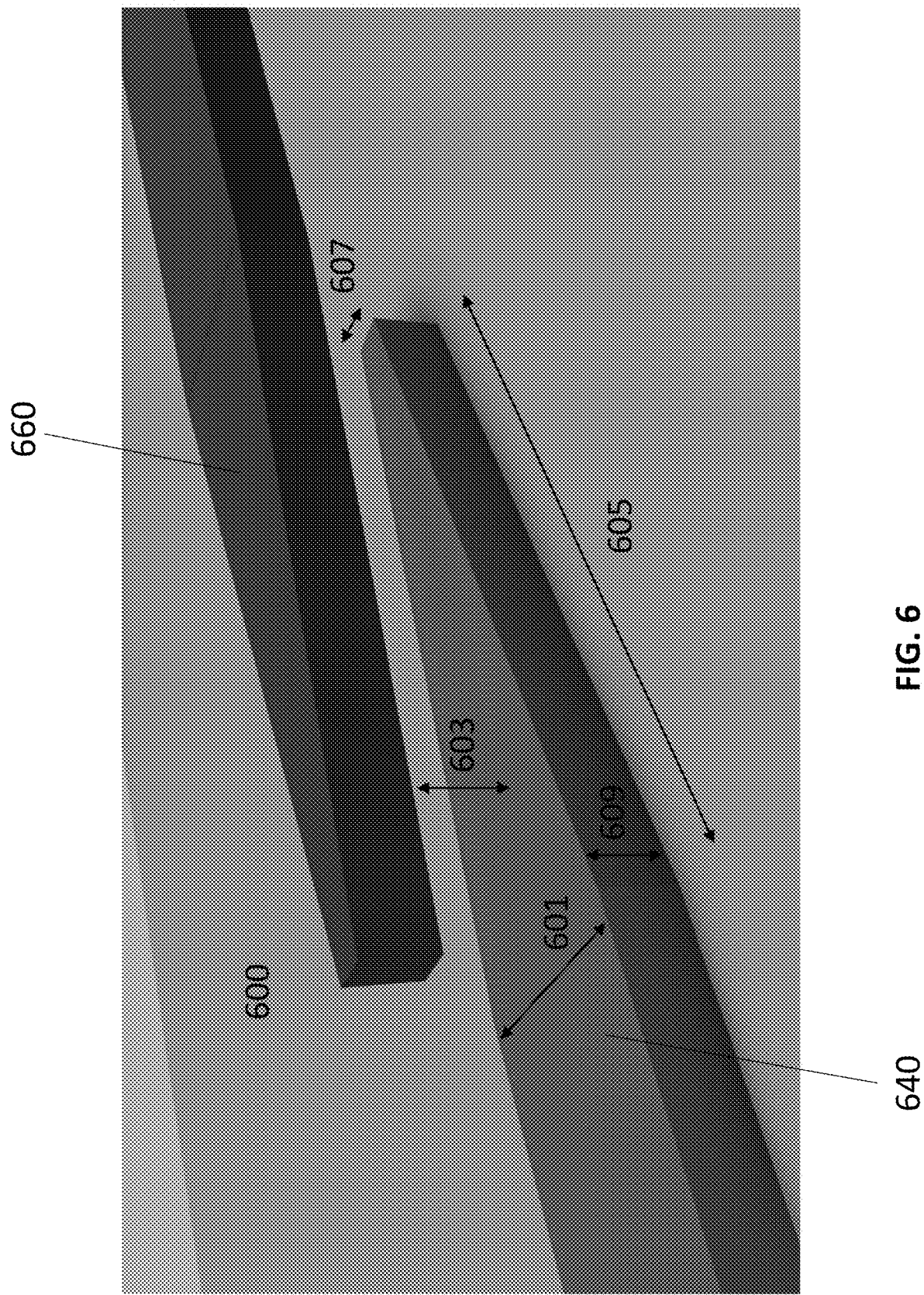
FIG. 6 shows a perspective view of two vertical cross-taper couplers from FIG. 1A with vertically overlapping tapered portions.

FIG. 6 shows a pair of optically coupled cross-taper couplers 600 that allow for vertical coupling between waveguides 640 and 660 that guide light in parallel planes. Both waveguide 640 and 660 terminate with a tapered coupler and the tapered couplers vertically overlap. The widths of each tapered end are smaller than the width of the corresponding waveguide to effectively lower the effective refractive index of the waveguide and allow for greater evanescence. A cross-taper coupler is characterized by the width of the waveguide 601, the vertical spacing between the two waveguides 603, the length of the taper 605, the width of the taper 607, and the height of the waveguide 609. The cross-taper couplers 600 transmit light from a bottom waveguide 640 to a higher-level waveguide 660. For example, the waveguide 640 can be on a chip carrier and the waveguide 660 can be in the PIC, and the coupler transmits light from the chip carrier to the PIC, or vice-versa.

The refractive indices of the materials of the cross-taper couplers, including the core and cladding, determine the geometry and dimensions of the cross-taper. As the index of the core of the cross-taper coupler increases, the tip width decreases in order to obtain a lower effective index and therefore greater evanescence. The waveguides 640 and 660 can have the same refractive indices or different refractive indices. For example, both waveguides can be silicon nitride each with a refractive index of about 2.0 and surrounded by cladding like silicon dioxide with a refractive index of 1.45. The tapered couplers can be silicon nitride, silicon, amorphous silicon, silicon oxynitride, silicon-germanium, polymer, or doped silica. The cladding can be silicon dioxide, silicon oxynitride, or polymer. In this example, for a silicon nitride lower waveguide and silicon nitride upper waveguide, the lower waveguide width 601 is 1.25 µm, the vertical spacing 603 is 200 nm, the length of the taper 605 is 60 µm, the width of the taper 607 is 200 nm, and the height of the waveguide 609 is 200 nm. In this configuration, the minimum tip width of the lower waveguide lies directly beneath the maximum width of the upper waveguide. The taper width 607 is chosen according to the wavelength of transmission and refractive indices of the core and the cladding. The minimum taper width 607 is constrained by the minimum feature size obtainable by lithography.

In an alternate design, the cross-taper couplers can transmit light from the top waveguide 660 to the bottom waveguide 640. For example, the waveguide 640 can be on a chip carrier and the waveguide 660 can be in the PIC, and the coupler transmits light from the PIC to the chip carrier. In this alternate design, both waveguides can have the same refractive index. For example, both waveguides can be silicon nitride. Alternatively, the waveguide 640 has a higher refractive index than the waveguide 660 or vice-versa. For example, waveguide 640 is silicon-germanium and waveguide 660 is silicon nitride. In another alternative version, the waveguide 640 has a lower refractive index than the waveguide 660 and the optical interconnect system has symmetry on the input and output sides, allowing for easier fabrication.

Figures 7A, 7B:
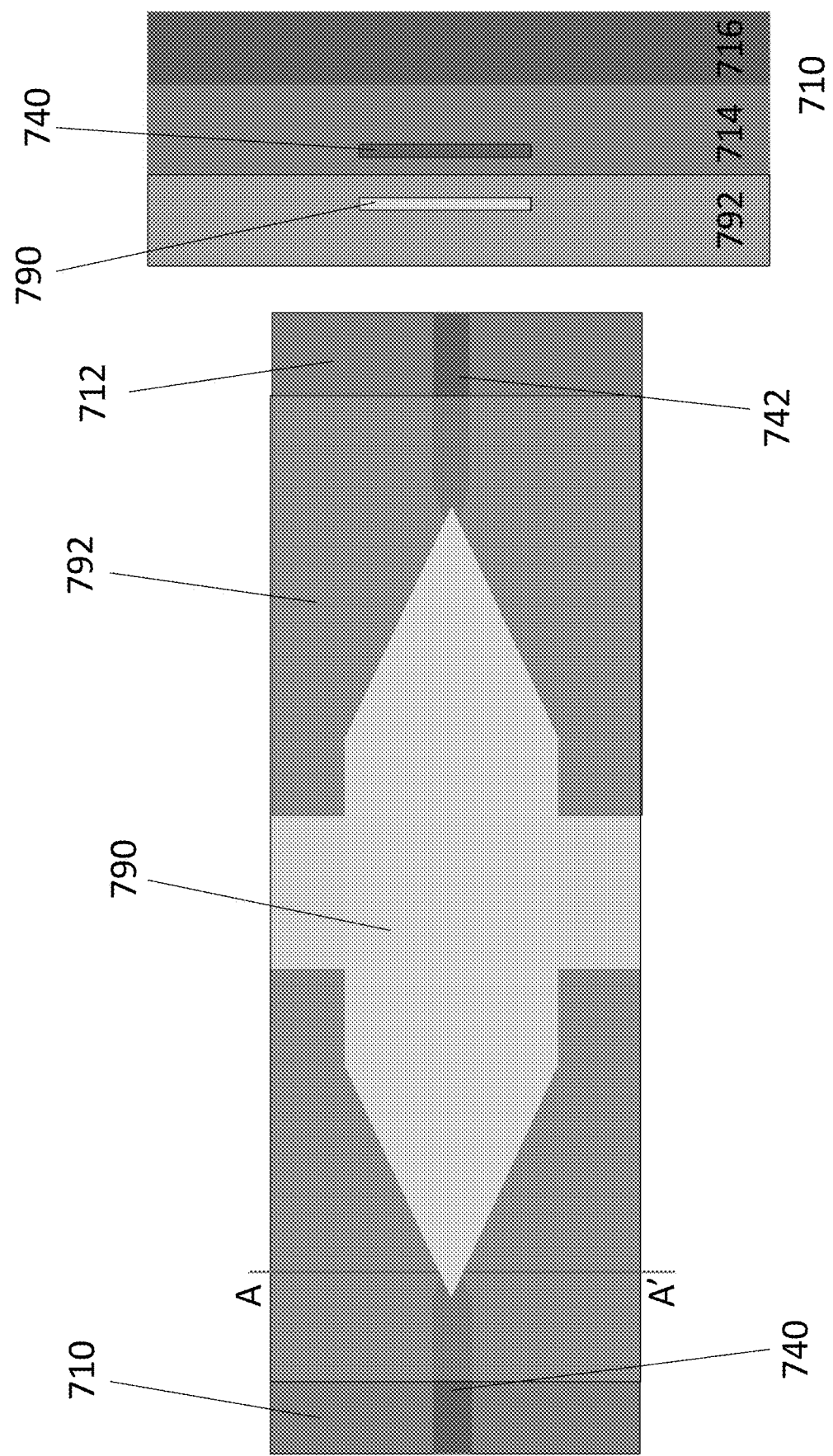
FIG. 7A shows a plan view of mated vertical cross-taper couplers optically coupling two chip carriers.
FIG. 7B shows a profile view of the vertical couplers shown in FIG. 7A.

FIGS. 7A and 7B show plan and cross-sectional views, respectively, of cross-taper couplers acting as optical pins to optically couple two components. FIG. 7B shows a cross-sectional view of the schematic shown in FIG. 7A at the line A to A'. The cross-taper couplers can be used to optically couple adjacent chip carriers, adjacent PICs, or a chip carrier adjacent to a PIC. FIG. 7A shows an optical pin including a waveguide core 790 with two tapered ends surrounded by cladding 792. The optical pin is mounted above two chip carriers and a BGA can be used to improve the alignment between the adjacent chips due to surface tension pull-in. One tapered end of the optical pin core 790 overlaps a tapered end of a waveguide 740 on a first chip carrier 710 and the other tapered end of the optical pin core 790 overlaps a tapered end of a waveguide 742 on a second chip carrier 712, thereby optically coupling the first chip carrier and the second chip carrier. The propagating mode is transferred via effective index coupling between the first chip carrier 710 and the second chip carrier 712. Though FIG. 7A depicts optical pin core 790 as a single straight waveguide, the optical pin core 790 can have a variety of shapes and sizes in order to allow for greater flexibility in optically couple two adjacent components. For example, the optical pin core 790 can be designed to accommodate tilting or alignment offset between adjacent components.

The optical pin waveguide core 790 is wider than its single mode size and is narrowed horizontally toward its edges. The refractive indices of the waveguide cores 790, 740, and 742 are higher than the claddings surrounding each waveguide. FIG. 7B shows the waveguide 740 surrounded by an optical cladding 714 and the optical cladding 714 disposed on a substrate 716. The waveguides 740 and 742 can also be silicon, silicon-germanium, silicon nitride, polymer, or doped silica. The optical pin waveguide 790 can also be silicon nitride, polycrystalline silicon, silicon oxynitride, polymer, or chalcogenide. The optical claddings 714 and 792 can be silicon dioxide, silicon oxynitride, polymer, or chalcogenide. As an example, the chip carrier waveguides 740 and 742 are silicon nitride and the optical pin waveguide 790 is amorphous silicon. In an alternative example, the optical pin core 790 can be GeSbSe with a lower index cladding 792 of GeSbS or silicon dioxide. Chalcogenides are appropriate for applications using mid-IR and longwave IR regimes.

FIG. 8 shows the parameters used for modeling coupling losses with alignment offsets shows the alignment tolerance between a GRIN lens and an optical fiber. Modeling experiments were conducted to determine coupling losses for alignment offsets in all three dimensions. Modelling was performed using Lumerical Simulation software. The x-dimension was defined as the horizontal distance between the GRIN lens and the optical fiber. The y-dimension was defined as horizontal offset between the GRIN lens and the optical fiber. The z-dimension was defined as the vertical offset between the GRIN lens and the optical fiber.

Figure 9:
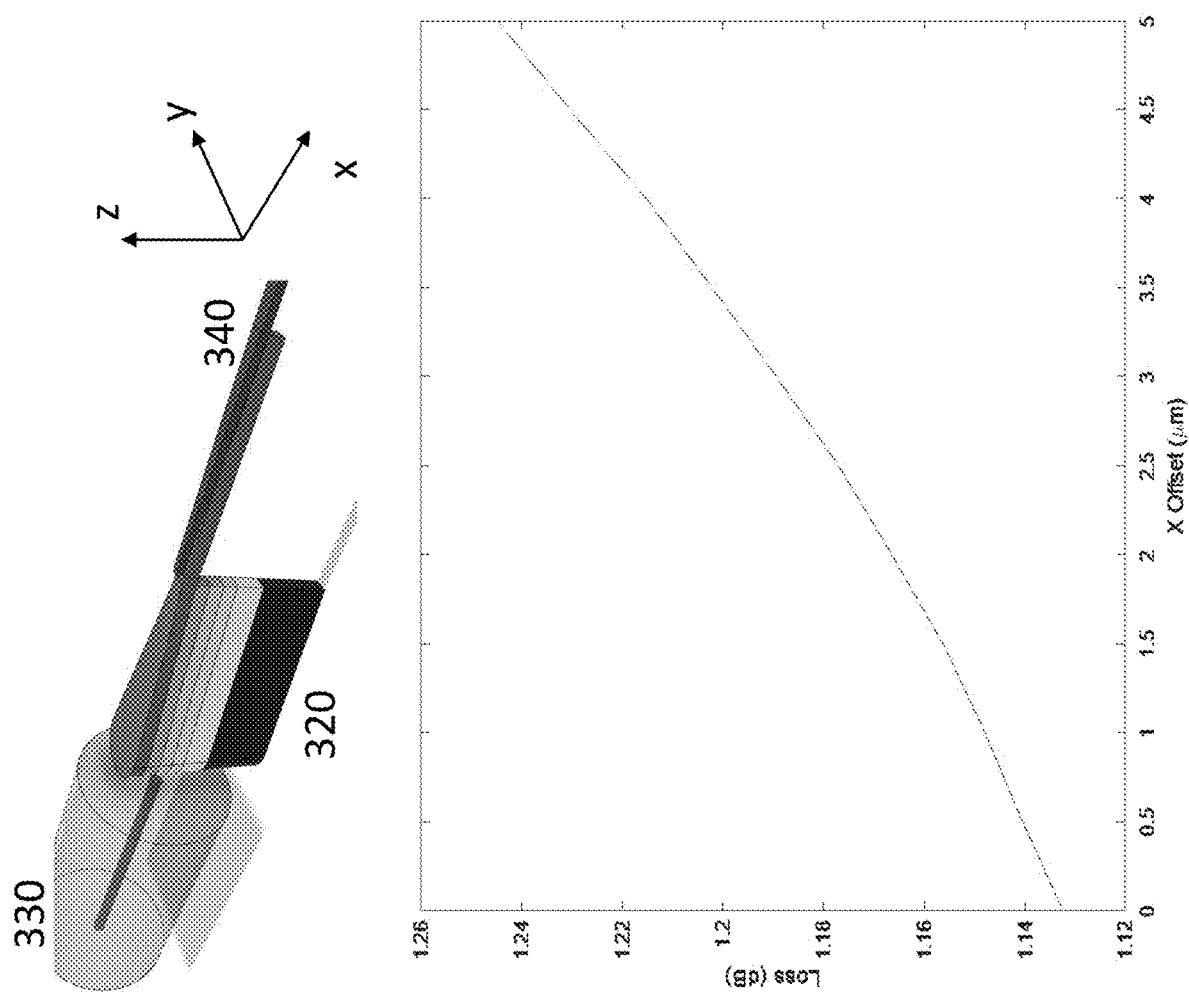
FIG. 9 shows the alignment tolerance of coupling an optical fiber and a tapered graded index lens in the X-direction using the parameters in FIG. 8.
Figure 10:
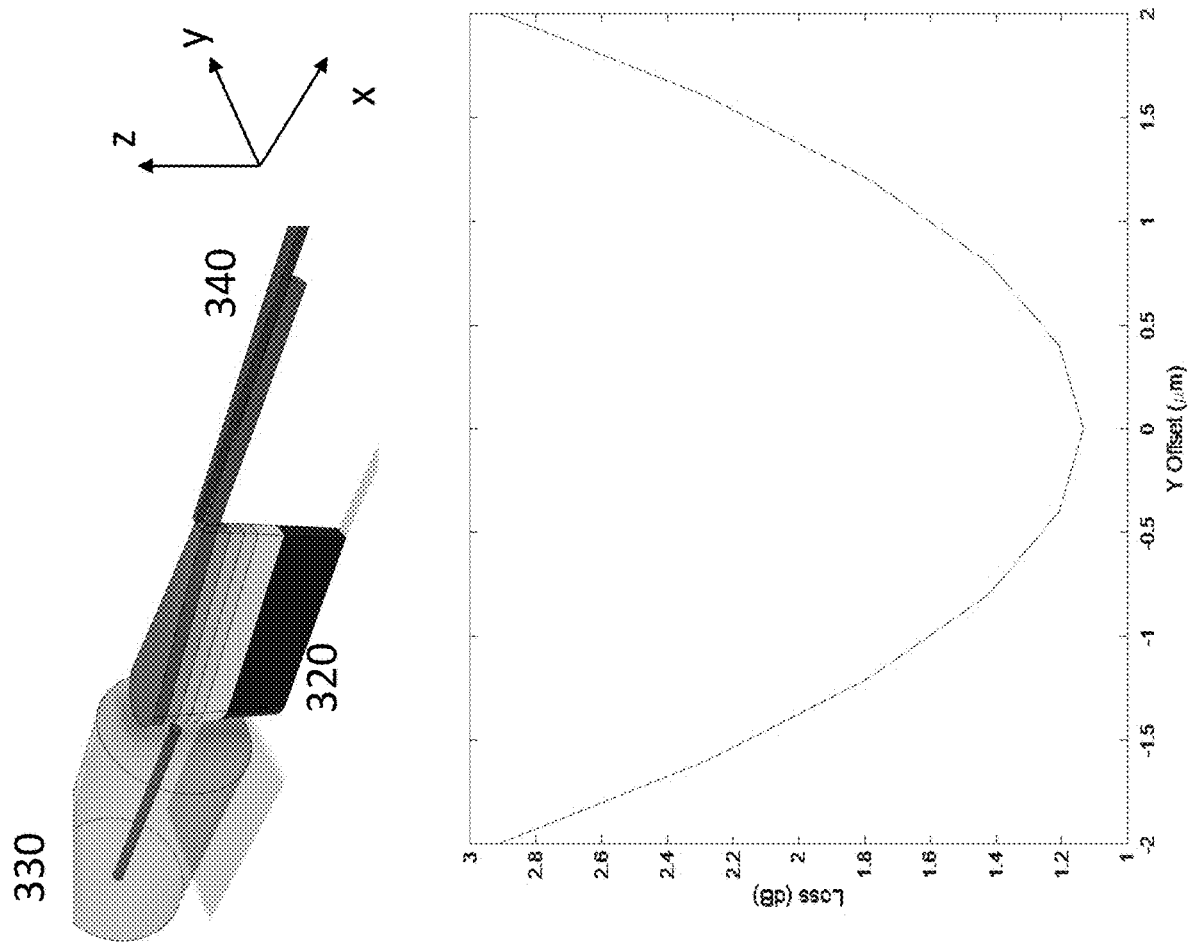
FIG. 10 shows the alignment tolerance of an optical fiber and a tapered graded index lens in the Y-direction using the parameters in FIG. 8.
Figure 11:
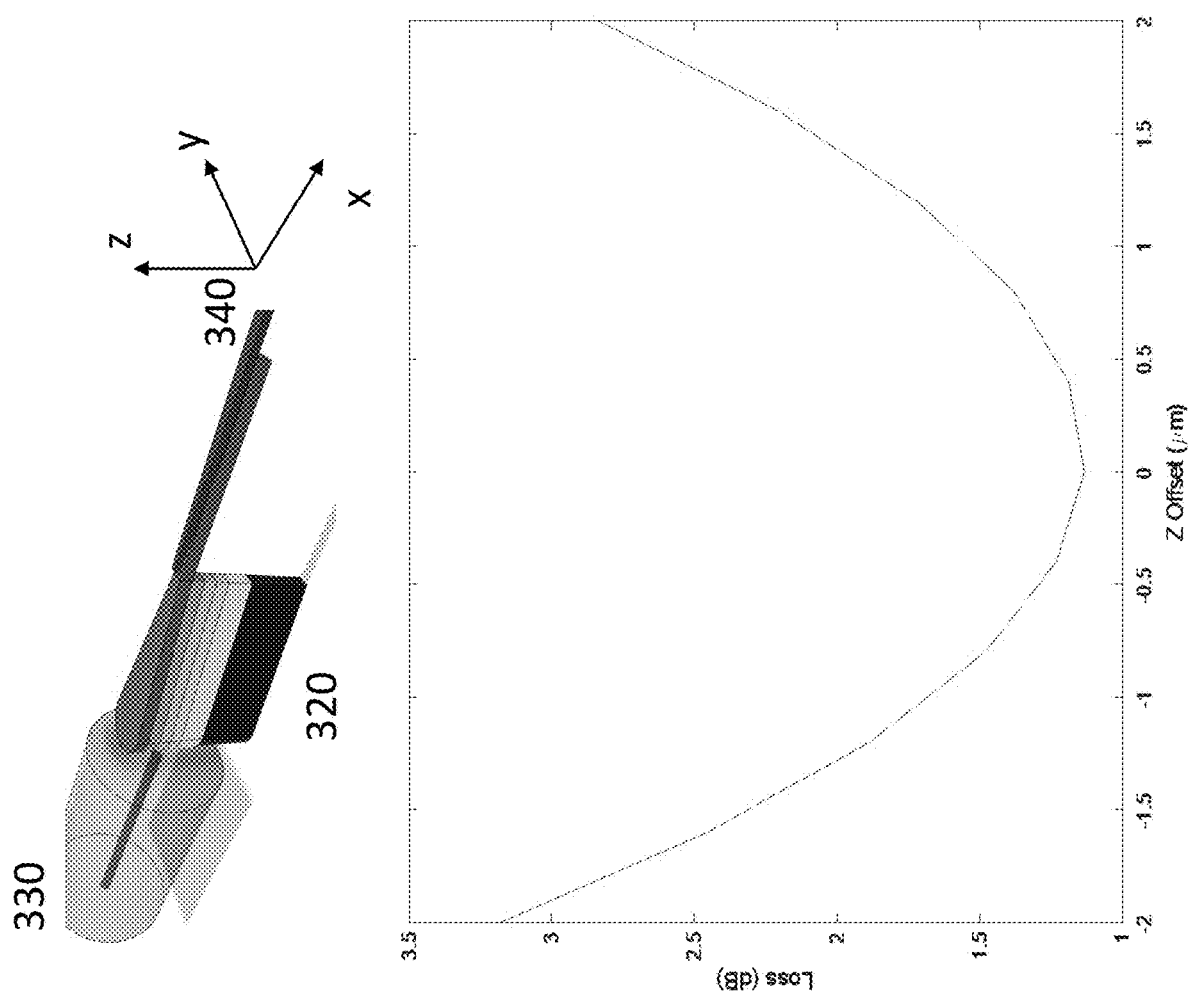
FIG. 11 shows the alignment tolerance of an optical fiber and a tapered graded index lens in the Z-direction using the parameters in FIG. 8.

FIG. 9 shows the results of modeling the x-dimensional offset. The interface has a coupling loss of less than 1.15 dB at a ±1 µm offset in the x-direction. FIG. 10 shows the results of modeling the y-dimensional offset. The interface has a coupling loss of less than 1.7 dB at a ±1 µm offset in the y-direction. FIG. 11 shows the results of modeling the z-dimensional offset. The interface has a coupling loss of less than 1.8 dB at a ±1 µm offset in the z-direction. These results indicate that alignment in the y-direction is most critical for decreasing coupling losses. These results indicate a robust alignment tolerance between the GRIN lens and the optical fiber, where a ±1 µm offset in any direction results in less than 2 dB of coupling loss.

Figure 12:
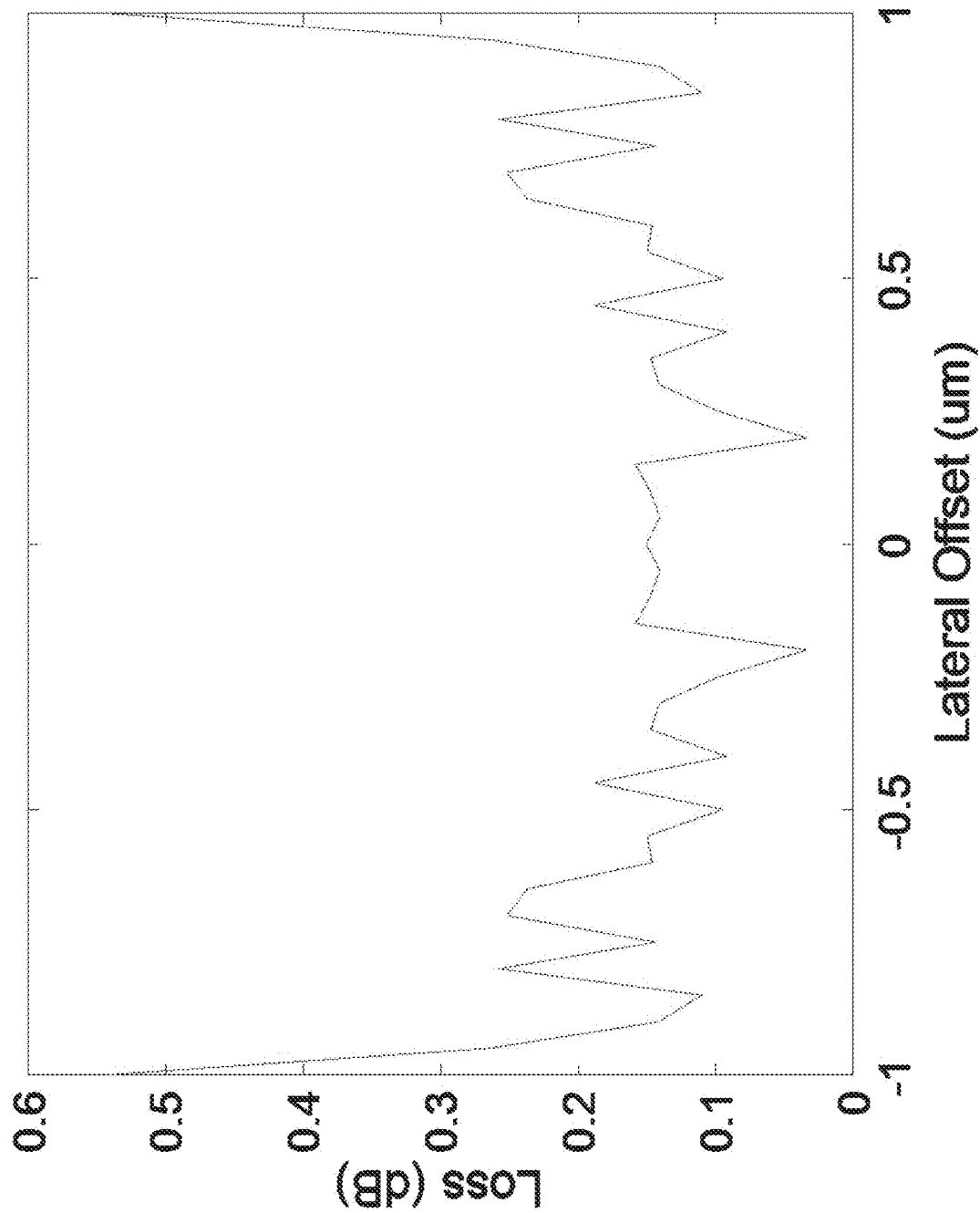
FIG. 12 shows the alignment tolerance of two vertical cross-taper couplers.
Figure 13:
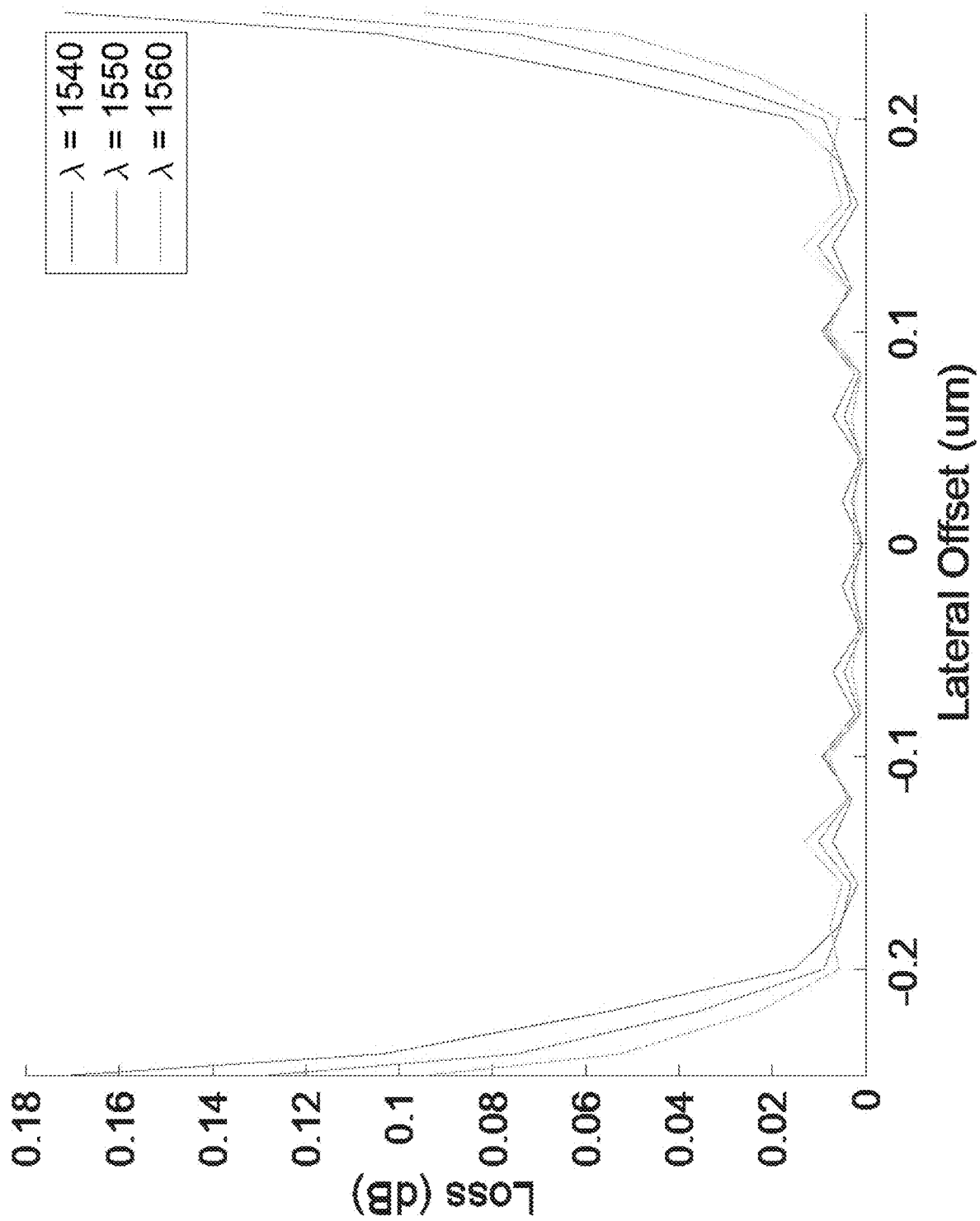
FIG. 13 shows the alignment tolerance of two other vertical cross-taper couplers.

Modeling of coupling losses with alignment offsets shows the alignment tolerance between two cross-taper couplers. FIGS. 12 and 13 show modeling experiments for coupling losses with lateral alignment offset using different cross-taper coupler parameters. Both FIGS. 12 and 13 are for an amorphous silicon tapered waveguide coupled to a crystalline silicon waveguide.

FIG. 12 shows coupling losses for a pair of cross-taper couplers where both couplers have a waveguide width of 3 µm, a vertical spacing between waveguides of 200 nm, a taper length of 360 µm, a taper width of 200 nm, and a waveguide height of 200 nm. At a ±1 µm lateral offset, the coupling loss is less than 0.6, for a coupling efficiency of greater than 95%.

FIG. 13 shows coupling losses for a pair of cross-taper couplers where both couplers have a waveguide width of 500 nm, a vertical spacing between waveguides of 200 nm, a taper length of 60 µm, a taper width of 200 nm, and a waveguide height of 200 nm. At a ±200 nm lateral offset, the coupling loss is less than 0.02 dB, for a coupling efficiency of greater than 99.5%. Coupling losses were similar for three wavelengths of light tested, 1540 nm, 1550 nm, and 1560 nm.

The components described above use materials and refractive indices that are compatible with a light source in the O, C, L, U bands, between about 1260 and about 1675 nm. However, the materials described above are transparent over a broad band of wavelengths, and other wavelengths can be used. Alternatively, mid-wavelength IR (3,000 nm-8,000 nm) or long-wavelength IR (8,000 nm-15,000 nm) light sources can be used. In this case, components may include chalcogenide glasses, lead chalcogenides, germanium, and alumina materials. Component functionality at these wavelengths depends on material transparency, absorption, refractive index, and other properties.

Figure 14:
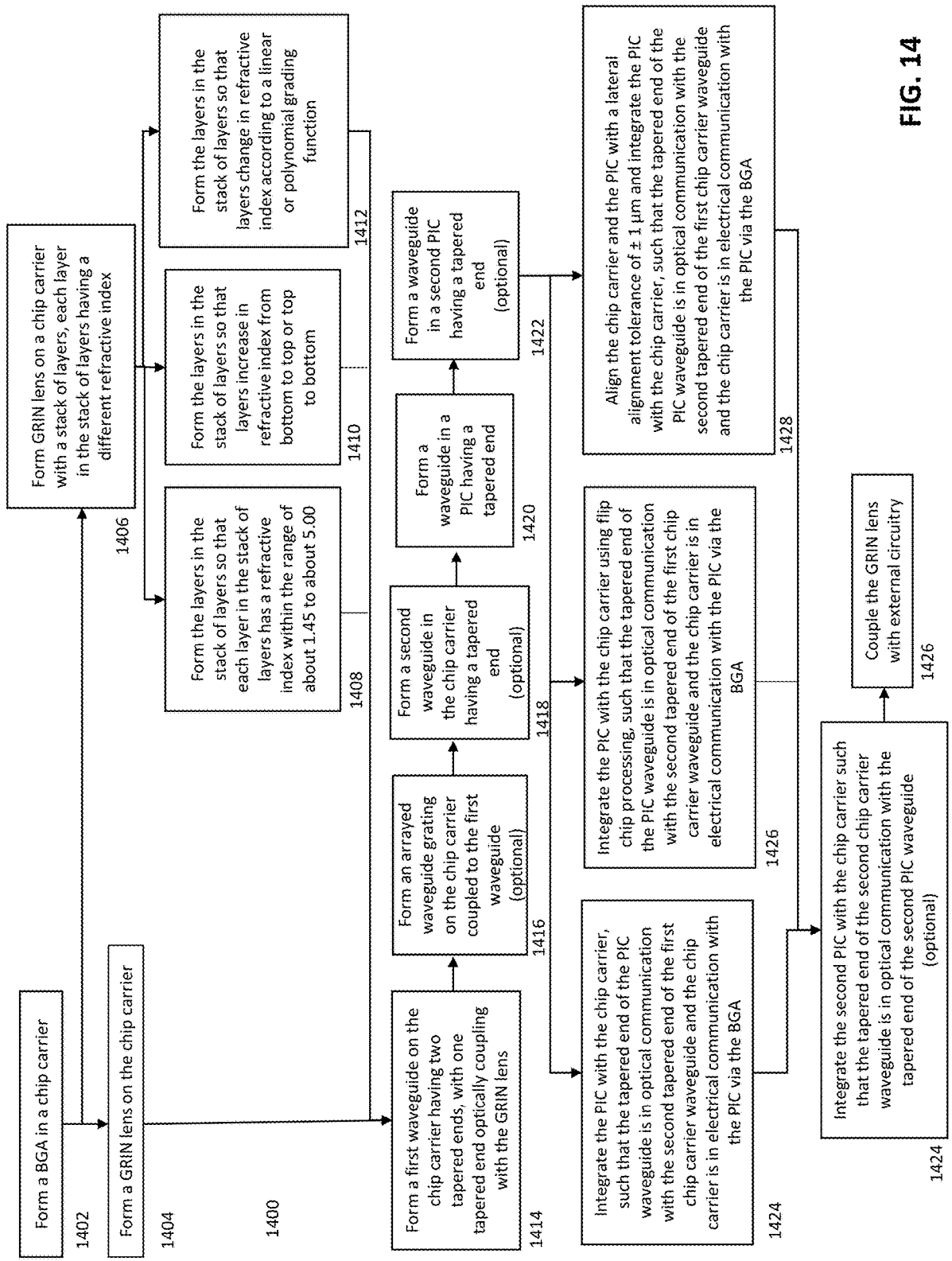
FIG. 14 shows a flowchart of the process to make the optical interconnect technology of the present application.

FIG. 14 shows a process 1400 of making and assembling optically interconnected PICs and chip carriers. The waveguides, coupling structures, and other components on the PIC and chip carrier can be fabricated using conventional lithography techniques. Prior to assembly, components are fabricated on the chip carrier and separately on the PIC. First, the BGA is formed 1402 on the chip carrier. The GRIN lens is formed 1404 on the chip carrier. Formation of the GRIN lens may include forming a stack of layers 1406, with subsequent layers in the stack of layers having higher or lower refractive indexes. If forming the GRIN lens includes forming a stack of layers 1406, then forming the GRIN lens may include additional steps. Forming the stack of layers 1406 may include forming the layers 1408 so that each layer has a refractive index within the range of about 1.45 to about 5.00. Forming the stack of layers 1406 may include forming the layers 1410 so that the layers either increase in refractive index from a bottom layer to a top layer or decrease in refractive index from a bottom layer to a top layer. Forming the stack of layers 1406 may include forming the layers 1412 so that the layers change in refractive index according to a grading function that is one of a linear function or a polynomial function.

After the formation of the GRIN lens by any of the methods above, a first waveguide is formed 1414 on the chip carrier. This waveguide has two tapered ends, with one tapered end optically coupling with the GRIN lens. Then one or more AWGs may be formed 1416 on the chip carrier such that they couple to the first chip carrier waveguide. If a second PIC is to be integrated with the chip carrier, then a second waveguide may be formed 1418 on the chip carrier, with the second chip carrier waveguide having a tapered end to couple with a waveguide in the second PIC. A PIC waveguide is formed 1420 in the first PIC, with the PIC waveguide having a tapered end. If a second PIC is to be integrated with the chip carrier, then a PIC waveguide is formed 1422 in the second PIC.

Then the PIC is integrated 1424 with the chip carrier, such that the tapered end of the PIC waveguide is in optical communication with the second tapered end of the first chip carrier waveguide, and the chip carrier is in electrical communication with the PIC via the BGA. If an index matching fluid is used, it can be applied between the PIC and the chip carrier using a fixed volume nozzle prior to electrical connection of the PIC to the chip carrier. Electrical connections between the chip carrier and the PIC by heating the solder bumps in the BGA. Integration may include using flip chip processing 1426. Integration may include aligning 1428 the chip carrier and the PIC with a lateral alignment tolerance of ±1 µm and a coupling efficiency between the first waveguide and the second waveguide of greater than 95%. During electrical connection, a mechanical sensor may be used to align the PIC on top of the chip carrier, where the sensor allows the chip carrier to be brought as close to the PIC as possible. If a second PIC is to be integrated with the chip carrier, then the second PIC is integrated 1424 with the chip carrier such that the tapered end of the second PIC waveguide is in optical communication with the tapered end of the second chip carrier waveguide. Finally, the GRIN lens is optically coupled 1426 with external circuitry.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of making a photonic integrated circuit coupled to external circuitry via a chip carrier, the method comprising:
    forming a ball grid array on the chip carrier;
    forming a graded index lens on the chip carrier, the graded index lens having a curved end, a tapered end, and a refractive index that varies with height;
    forming a first waveguide on the chip carrier wherein:
      the first waveguide has a first tapered end and a second tapered end, and
      the first tapered end of the first waveguide is in optical communication with the tapered end of the graded index lens;
    forming a second waveguide in the photonic integrated circuit, the second waveguide having a tapered end;
    integrating the photonic integrated circuit with the chip carrier such that the tapered end of the second waveguide is in optical communication with the second tapered end of the first waveguide and the chip carrier is in electrical communication with the first photonic integrated circuit via the ball grid array; and
    coupling the curved end of the graded index lens to an optical waveguide of the external circuitry.

2. The method of claim 1, wherein integrating the photonic integrated circuit with the chip carrier comprises flip chip processing.

3. The method of claim 1, wherein integrating the photonic integrated circuit with the chip carrier comprises aligning the chip carrier and the photonic integrated circuit with a lateral alignment tolerance of ±1 micrometer and a coupling efficiency greater than 95% between the first waveguide and the second waveguide.

4. The method of claim 1, wherein an insertion loss between the optical waveguide of the external circuitry and the graded index lens is less than 0.5 dB.

5. The method of claim 1, wherein forming the graded index lens on the chip carrier comprises forming a stack of layers, each layer in the stack of layers having a different refractive index, the stack of layers forming a cylindrical surface at one end of the graded index lens and a taper at the other end of the graded index lens.

6. The method of claim 5, wherein the layers in the stack of layers increase in refractive index from a bottom layer to a top layer.

7. The method of claim 5, wherein the layers in the stack of layers change in refractive index according to a grading function that is at least one of a linear function or a polynomial function.

8. The method of claim 5, wherein each layer in the stack of layers has a refractive index within the range of about 1.45 to about 5.00.

9. The method of claim 1, further comprising:
    forming an arrayed waveguide grating on the chip carrier coupled to the first waveguide.

10. The method of claim 1, wherein the photonic integrated circuit is a first photonic integrated circuit, and further comprising:
    forming a third waveguide on the chip carrier, the third waveguide having a tapered end;
    forming a fourth waveguide in a second photonic integrated circuit, the fourth waveguide having a tapered end; and
    integrating the second photonic integrated circuit with the chip carrier such that the tapered end of the third waveguide is in optical communication with the tapered end of the fourth waveguide.

11. An apparatus comprising:
    a chip carrier comprising:
      a graded index lens having a curved end, a tapered end, and a refractive index that varies with height, the curved end of the graded index lens in optical communication with an optical waveguide of an external circuitry;
      a chip carrier waveguide, the chip carrier waveguide having a first tapered end and a second tapered end, the first tapered end of the chip carrier waveguide in optical communication with the tapered end of the graded index lens; and a photonic integrated circuit comprising a circuit waveguide having a tapered end, the tapered end of the circuit waveguide in optical communication with the second tapered end of the chip carrier waveguide.

12. The apparatus of claim 11, wherein:

the graded index lens is a first graded index lens;

the optical waveguide of the external circuitry is a first optical waveguide of the external circuitry;

the chip carrier waveguide is a first chip carrier waveguide; and the circuit waveguide is a first circuit waveguide; and further comprising:

a second circuit waveguide in the photonic integrated circuit having a tapered end;

a second chip carrier waveguide on the chip carrier, the second chip carrier waveguide having a first tapered end and a second tapered end, the first tapered end of the second chip carrier waveguide in optical communication with the tapered end of the second circuit waveguide; and a second graded index lens, the second graded index lens having a curved end, a tapered end, and a refractive index that varies with height, wherein:

the tapered end of the second graded index lens is in optical communication with the second tapered end of the second chip carrier waveguide, and the curved end of the second graded index lens is in optical communication with a second optical waveguide of the external circuitry.

13. The apparatus of claim 11, wherein the apparatus is integrated using flip chip processing.

14. The apparatus of claim 11, wherein a lateral alignment tolerance between the chip carrier and the photonic integrated circuit is ±1 micrometer and a coupling efficiency between the chip carrier waveguide and the circuit waveguide is greater than 95%.

15. The apparatus of claim 11, wherein an insertion loss between the optical waveguide of the external circuitry and the graded index lens is less than 0.5 dB.

16. The apparatus of claim 11, wherein the chip carrier waveguide is a single-mode waveguide.

17. The apparatus of claim 11, wherein the graded index lens has a stack of layers, each layer in the stack of layers having a different refractive index.

18. The apparatus of claim 17, wherein the layers in the stack of layers increase in refractive index from a bottom layer to a top layer.

19. The apparatus of claim 17, wherein the layers in the stack of layers decrease in refractive index from a bottom layer to a top layer.

20. The apparatus of claim 17, wherein the layers in the stack of layers vary in refractive index according to a grading function that is at least one of a linear function or a polynomial function.

21. The apparatus of claim 17, wherein each layer in the stack of layers has a refractive index within the range of about 1.45 to about 5.00.

22. The apparatus of claim 11, wherein the chip carrier additionally comprises an arrayed waveguide grating optically coupled to the chip carrier waveguide.

23. The apparatus of claim 11, wherein the graded index lens comprises at least one of silicon oxynitride, silicon nitride, silicon-germanium, silicon, silicon dioxide, chalcogenide glass, lead chalcogenide, germanium, or aluminum oxide.

24. The apparatus of claim 11, wherein the chip carrier waveguide comprises at least one of silicon, silicon-germanium, silicon nitride, polymer, amorphous silicon, or doped silica, chalcogenide glass, lead chalcogenide, germanium, or aluminum oxide.

25. The apparatus of claim 11, wherein the chip carrier waveguide and the circuit waveguide comprise different materials.

26. The apparatus of claim 11, wherein the chip carrier waveguide and the circuit waveguide comprise the same material.

27. The apparatus of claim 11, wherein the chip carrier waveguide has a refractive index of about 1.5 to about 5.

28. The apparatus of claim 11, wherein the optical waveguide of the external circuitry is at least one of an optical fiber or a waveguide.

29. The apparatus of claim 11, wherein the chip carrier further comprises a cladding comprising at least one of silicon dioxide, silicon oxynitride, polymer, aluminum oxide, or chalcogenide glass.

30. The apparatus of claim 11, wherein the apparatus is configured to transmit light in a wavelength range of 1260 nm to 1675 nm.

31. The apparatus of claim 11, wherein the apparatus is configured to transmit light in a wavelength range of 3000 nm to 8000 nm.

32. The apparatus of claim 11, wherein the apparatus is configured to transmit light in a wavelength range of 8000 nm to 15,000 nm.

33. The apparatus of claim 11, wherein the chip carrier further comprises a readout integrated circuit.

* * * * *